United States Patent
Chindalore et al.

(10) Patent No.: US 7,211,487 B2
(45) Date of Patent: *May 1, 2007

(54) PROCESS FOR FORMING AN ELECTRONIC DEVICE INCLUDING DISCONTINUOUS STORAGE ELEMENTS

(75) Inventors: Gowrishankar L. Chindalore, Austin, TX (US); Paul A. Ingersoll, Austin, TX (US); Criag T. Swift, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 45 days.

This patent is subject to a terminal disclaimer.

(21) Appl. No.: 11/188,939

(22) Filed: Jul. 25, 2005

(65) Prior Publication Data

US 2007/0020857 A1 Jan. 25, 2007

(51) Int. Cl.
 *H01L 21/336* (2006.01)
 *H01L 29/76* (2006.01)

(52) U.S. Cl. ............. 438/270; 438/212; 438/243; 257/330; 257/332; 977/707

(58) Field of Classification Search ........... 438/212, 438/213, 259, 243, 270; 257/302, 702, 707; 977/707, 702, 723, 943
See application file for complete search history.

(56) References Cited

U.S. PATENT DOCUMENTS

| | | | |
|---|---|---|---|
| 4,860,070 A | 8/1989 | Arimoto et al. |
| 5,705,415 A | 1/1998 | Orlowski et al. |
| 5,721,448 A | 2/1998 | Hauf et al. |
| 5,824,580 A | 10/1998 | Hauf et al. |
| 5,914,523 A | 6/1999 | Bashir et al. |
| 5,969,383 A | 10/1999 | Chang et al. |
| 6,074,954 A | 6/2000 | Lill et al. |
| 6,121,148 A | 9/2000 | Bashir et al. |
| 6,307,782 B1 | 10/2001 | Sadd et al. |
| 6,320,784 B1 | 11/2001 | Muralidhar et al. |
| 6,330,184 B1 | 12/2001 | White et al. |
| 6,399,441 B1 | 6/2002 | Ogura et al. |
| 6,583,466 B2 | 6/2003 | Lin et al. |
| 6,674,120 B2 | 1/2004 | Fujiwara |
| 6,706,599 B1 | 3/2004 | Sadd et al. |
| 6,818,512 B1 | 11/2004 | Hsieh |
| 6,894,339 B2 | 5/2005 | Fan et al. |

(Continued)

OTHER PUBLICATIONS

Guan, H., et al. "An Analytical Model for Optimization of Programming Efficiency and Uniformity of Split Gate Source-Side Injection Superflash Memory," IEEE Transactions on Electron Devices, vol. 50, No. 3, pp. 809-815, Mar. 2003.

(Continued)

*Primary Examiner*—Long K. Tran

(57) ABSTRACT

A process for forming an electronic device can include forming a first trench within a substrate, wherein the trench includes a wall and a bottom and extends from a primary surface of the substrate. The process can also include forming discontinuous storage elements and forming a first gate electrode within the trench such that, a first discontinuous storage element of the discontinuous storage elements lies between the first gate electrode and the wall of the trench. The process can further include removing the discontinuous storage elements that overlie the primary surface of the substrate. The process can still further include forming a second gate electrode that overlies the first gate electrode and the primary surface of the substrate.

20 Claims, 17 Drawing Sheets

U.S. PATENT DOCUMENTS

| | | | |
|---|---|---|---|
| 6,916,715 | B2 | 7/2005 | Hsiao et al. |
| 6,936,887 | B2 | 8/2005 | Harari et al. |
| 7,015,537 | B2 | 3/2006 | Lee et al. |
| 7,098,502 | B2 * | 8/2006 | Mathew et al. ............. 257/308 |
| 2002/0151136 | A1 | 10/2002 | Lin et al. |
| 2003/0062565 | A1 | 4/2003 | Yamazaki et al. |
| 2003/0068864 | A1 | 4/2003 | Il-Yong et al. |
| 2004/0000688 | A1 | 1/2004 | Harari et al. |
| 2004/0121540 | A1 | 6/2004 | Lin |
| 2004/0248371 | A1 | 12/2004 | Wang |
| 2005/0037576 | A1 | 2/2005 | Chen et al. |
| 2005/0148173 | A1 * | 7/2005 | Shone ........................ 438/672 |
| 2005/0259475 | A1 | 11/2005 | Forbes |
| 2005/0280089 | A1 | 12/2005 | Forbes |
| 2005/0280094 | A1 | 12/2005 | Forbes |
| 2006/0152978 | A1 | 7/2006 | Forbes |
| 2006/0166443 | A1 | 7/2006 | Forbes |

OTHER PUBLICATIONS

Hayashi, Y., et al. "Twin MONOS Cell with Dual Control Gates," 2000 Symposium on VLSI Technology Digest of Technical Papers, pp. 122-123, 2000.

Lee, D., et al. "Vertical Floating-Gate 4.5F2 Split-Gate NOR Flash Memory at 110nm Node," 2004 Symposium on VLSI Technology Digest of Technical Papers, pp. 72-73, 2004.

Ma, Y. et al. "A Dual-Bit Split-Gate EEPROM (DSG) Cell in Contactless Array for Single-Vcc High Density Flash Memories," IEDM, p. 57-60, 1994.

Osabe, T. et al. "Charge-Injection Length in Silicon Nanocrystal Memory Cells," 2004 Symposium on VLSI Technology Digest of Technical Papers p. 242-243, 2004.

Van Houdt, J., et al. "An Analytical Model for the Optimization of Source-Side Injection Flash EEPROM Devices," IEEE Transactions on Electron Devices, vol. 42, No. 7, pp. 1314-1320, Jul. 1995.

U.S. Appl. No. 10/961,295, filed Oct. 8, 2004.
U.S. Appl. No. 11/079,674, filed Mar. 14, 2005.
U.S. Appl. No. 11/188,935, filed Jul. 25, 2005.
U.S. Appl. No. 11/188,999, filed Jul. 25, 2005.
U.S. Appl. No. 11/188,953, filed Jul. 25, 2005.
U.S. Appl. No. 11/188,898, filed Jul. 25, 2005.
U.S. Appl. No. 11/188,910, filed Jul. 25, 2005.
U.S. Appl. No. 11/188,909, filed Jul. 25, 2005.
U.S. Appl. No. 11/188,591, filed Jul. 25, 2005.
U.S. Appl. No. 11/188,584, filed Jul. 25, 2005.
U.S. Appl. No. 11/188,588, filed Jul. 25, 2005.
U.S. Appl. No. 11/188,603, filed Jul. 25, 2005.
U.S. Appl. No. 11/188,615, filed Jul. 25, 2005.
U.S. Appl. No. 11/188,582, filed Jul. 25, 2005.
U.S. Appl. No. 11/188,583, filed Jul. 25, 2005.
U.S. Appl. No. 11/188,604, filed Jul. 25, 2005.
U.S. Appl. No. 11/188,585, filed Jul. 25, 2005.
U.S. Appl. No. 11/525,747, filed Sep. 22, 2006.
U.S. Appl. No. 11/626,762, filed Jan. 24, 2007.
U.S. Appl. No. 11/626,753, filed Jan. 24, 2007.
U.S. Appl. No. 11/626,768, filed Jan. 24, 2007.

* cited by examiner

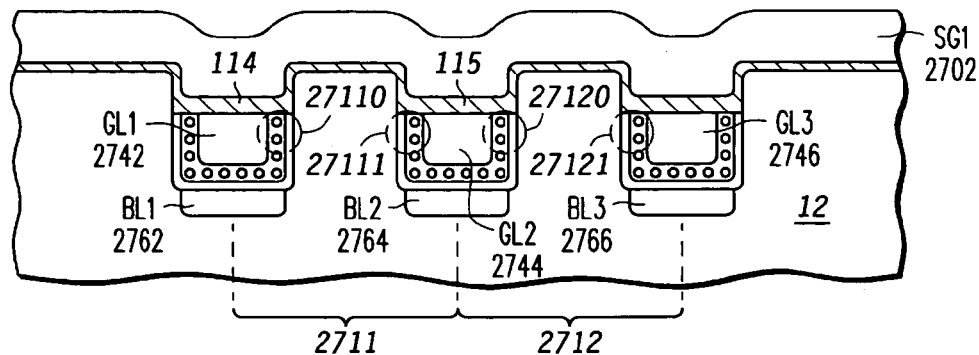
FIG. 32
| | SG1 2702 | SG2 2704 | GL1 2742 | GL2 2744 | GL3 2746 | BL1 2762 | BL2 2764 | BL3 2766 |
|---|---|---|---|---|---|---|---|---|
| PGM 27110 | 3 | 0 | 8 | 6 | 0 | 5 | 0 | 0 |
| READ 27110 | 3 | 0 | 3.5 | 6 | 0 | 0 | 2 | 0 |
| PGM 27111 | 3 | 0 | 6 | 8 | 0 | 0 | 5 | 0 |
| READ 27111 | 3 | 0 | 6 | 3.5 | 0 | 2 | 0 | 0 |
| PGM 27120 | 3 | 0 | 0 | 8 | 6 | 0 | 5 | 0 |
| READ 27120 | 3 | 0 | 0 | 3.5 | 6 | 0 | 0 | 2 |
| PGM 27121 | 3 | 0 | 0 | 6 | 8 | 0 | 0 | 5 |
| READ 27121 | 3 | 0 | 0 | 6 | 3.5 | 0 | 2 | 0 |
FIG. 33
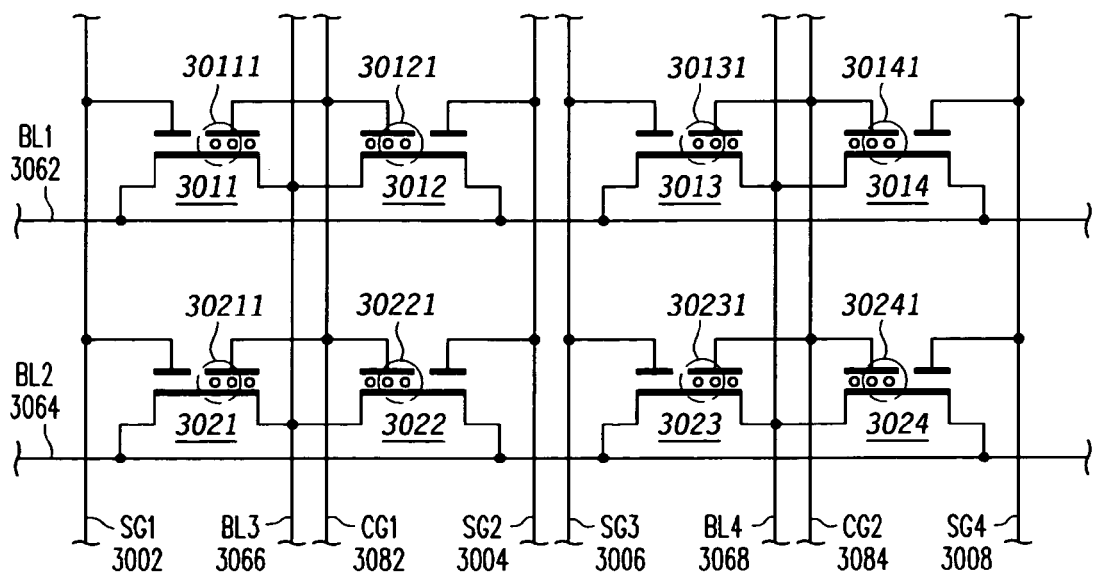
FIG. 34

| | SG1 3002 | SG2 3004 | SG3 3006 | SG4 3008 | CG1 3082 | CG2 3084 | BL1 3062 | BL2 3064 | BL3 3066 | BL4 3068 |
|---|---|---|---|---|---|---|---|---|---|---|
| PGM 30111 | 3 | 0 | 0 | 0 | 8 | 0 | 0 | F | 5 | 0 |
| READ 30111 | 3 | 0 | 0 | 0 | 3.5 | 0 | 2 | F | 0 | 0 |
| PGM 30121 | 0 | 3 | 0 | 0 | 8 | 0 | 0 | F | 5 | 0 |
| READ 30121 | 0 | 3 | 0 | 0 | 3.5 | 0 | 2 | F | 0 | 0 |
| PGM 30131 | 0 | 0 | 3 | 0 | 0 | 8 | F | 0 | 0 | 5 |
| READ 30131 | 0 | 0 | 3 | 0 | 0 | 3.5 | F | 2 | 0 | 0 |
| PGM 30141 | 0 | 0 | 0 | 3 | 0 | 8 | F | 0 | 0 | 5 |
| READ 30141 | 0 | 0 | 0 | 3 | 0 | 3.5 | F | 2 | 0 | 0 |

|  | SG1 3302 | SG2 3304 | CG1 3382 | CG2 3384 | BL1 3362 | BL2 3364 | BL3 3366 | BL4 3368 | BL5 3369 |
|---|---|---|---|---|---|---|---|---|---|
| PGM 33111 | 3 | 0 | 8 | 0 | 0 | 5 | F | F | F |
| READ 33111 | 3 | 0 | 3.5 | 0 | 2 | 0 | F | F | F |
| PGM 33121 | 3 | 0 | 8 | 0 | F | 5 | 0 | F | F |
| READ 33121 | 3 | 0 | 3.5 | 0 | F | 0 | 2 | F | F |
| PGM 33131 | 3 | 0 | 0 | 8 | F | F | 0 | 5 | F |
| READ 33131 | 3 | 0 | 0 | 3.5 | F | F | 2 | 0 | F |
| PGM 33141 | 3 | 0 | 0 | 8 | F | F | F | 5 | 0 |
| READ 33141 | 3 | 0 | 0 | 3.5 | F | F | F | 0 | 2 |

| | SG1 3602 | SG2 3604 | CG1 3682 | CG2 3684 | BL1 3662 | BL2 3664 | BL3 3666 | BL4 3668 | BL5 3670 | BL6 3672 |
|---|---|---|---|---|---|---|---|---|---|---|
| PGM 36111 | 3 | 0 | 8 | 0 | F | 5 | 0 | F | F | F |
| READ 36111 | 3 | 0 | 3.5 | 0 | F | 0 | 2 | F | F | F |
| PGM 36121 | 3 | 0 | 8 | 0 | F | 5 | F | 0 | F | F |
| READ 36121 | 3 | 0 | 3.5 | 0 | F | 0 | F | 2 | F | F |
| PGM 36131 | 3 | 0 | 0 | 8 | F | F | 0 | F | 5 | F |
| READ 36131 | 3 | 0 | 0 | 3.5 | F | F | 2 | F | 0 | F |
| PGM 36141 | 3 | 0 | 0 | 8 | F | F | F | 0 | 5 | F |
| READ 36141 | 3 | 0 | 0 | 3.5 | F | F | F | 2 | 0 | F |

PROCESS FOR FORMING AN ELECTRONIC DEVICE INCLUDING DISCONTINUOUS STORAGE ELEMENTS

CROSS-REFERENCE TO RELATED APPLICATIONS

This application is related to U.S. patent application Ser. Nos. 11,188,591 entitled "Electronic Device Including Discontinuous Storage Elements", by Chindalore et al. filed on Jul. 25, 2005, and Ser. No. 11/188,588 entitled "Electronic Device Including Gate Lines, Bit Lines, Or A Combination Thereof" by Chindalore et al. filed on Jul. 25, 2005, both of which are assigned to the current assignee hereof and incorporated herein by reference in their entireties.

BACKGROUND

1. Field of the Disclosure

The present invention relates to processes, and more particularly, to processes for forming electronic devices that include discontinuous storage elements.

2. Description of the Related Art

Floating gate non-volatile memories ("FG NVM") are conventional and are commonly used in many applications. The three most common types of programming mechanisms for FG NVM include Fowler-Nordheim tunneling, conventional hot carrier injection, and source-side injection. Fowler-Nordheim tunneling is efficient but is very slow. Efficiency can be measured by dividing the number of carriers that enter a floating gate or one or more other storage elements divided by the number of carriers that enter a memory cell having the floating or the other storage element(s). The latter number can be approximated by using the product of the programming current and the programming time.

Hot carrier injection can include conventional hot carrier injection and source-side injection. Both involve the generation of hot carriers, some of which are injected into the floating or the other storage element(s). In conventional hot carrier injection when using a floating gate, an electrical field is generated along a channel region of a memory cell. Within the channel region, the electrical field is the highest near the drain region. The electrical field accelerates carriers flowing within the channel region, such that, within the channel region, the carriers are traveling the fastest near the drain region. A small fraction of carriers collide with silicon or one or more other atoms within the channel region, redirecting the energetic carriers to the floating gate or other charge storage element(s). An electrical field generated by a control gate electrode can help inject some of that small fraction of the hot carriers into the floating gate. Conventional hot carrier injection is inefficient and has high programming current.

Source-side injection is a popular compromise, with respect to efficiency and programming current, between Fowler-Nordheim tunneling and conventional hot carrier injection. With source-side injection, hot carriers are still generated, however, most of the hot carriers are generated within a portion of the channel region that is spaced apart from the drain region. Memory cells designed to be programmed by source-side injection are not without problems. Typically, the memory cells require one or more additional critical lithographic sequences and result in larger memory cells.

High density floating gate memories are becoming more difficult to fabricate in commercial volumes. As the thickness of the gate dielectric layer decreases, the likelihood of a pinhole or other defect extending through the thickness of the gate dielectric layer increases. Such a defect can cause an electrical short or leakage path between the substrate and the floating gate. The electrical short or leakage path can affect the voltage on the floating gate, and therefore, the memory cell may not be able to retain data. One or more materials may be used for the gate dielectric layer instead of silicon dioxide, however, such material(s) may have other issues, such as material compatibility with other materials used in the memory cell, require new equipment, increase manufacturing costs, etc.

BRIEF DESCRIPTION OF THE DRAWINGS

The invention is illustrated by way of example and not limitation in the accompanying figures.

FIGS. 31 through 42 includes circuit schematic diagrams, cross-sectional views of exemplary physical embodiments of the circuit schematic diagrams, and operating voltage tables for memory cell along a row within an NVM array Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

Figure 1:
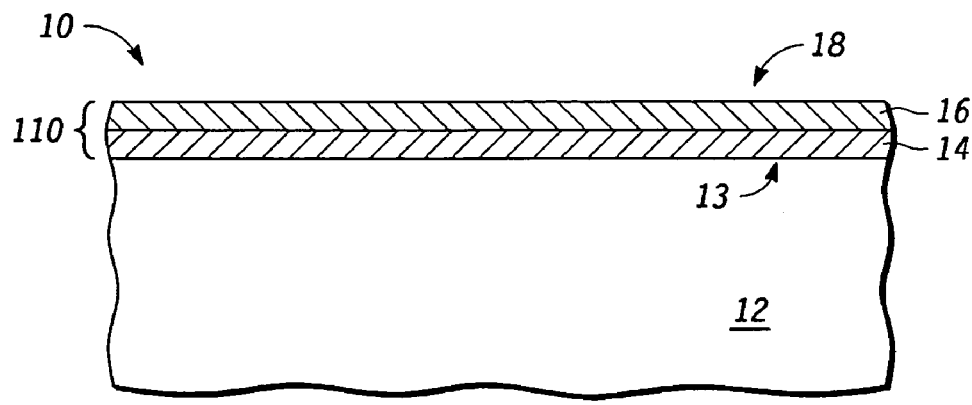
FIG. 1 includes an illustration of a cross-sectional view of a portion of a workpiece after formation of a protective layer.

An electronic device can include discontinuous storage elements that lie within a trench. The electronic device can include a substrate that includes a first trench and a second trench that are spaced apart from each other. Each of the first and second trenches includes a wall and a bottom and extends from a primary surface of the substrate. The electronic device can also include discontinuous storage elements, wherein a first portion of the discontinuous storage elements lie at least within the first trench, and a second portion of the discontinuous storage elements lie at least within the second trench. The electronic device can further include a first gate electrode overlying the first portion of the discontinuous storage elements, wherein an upper surface of the first gate electrode lies below the primary surface of the substrate. The electronic device can still further include a second gate electrode overlying the second portion the discontinuous storage elements, wherein an upper surface of the second gate electrode lies below the primary surface of the substrate. The electronic device can also include a third gate electrode overlying the first gate electrode, the second gate electrode, or a combination thereof. Embodiments described herein also include processes for forming the electronic device.

The electronic device can include a memory array in which bit lines, gate lines, or any combination thereof can take advantage of the trench design and buried bit lines. In one embodiment, a select gate line may be electrically connected to a different number of rows or columns of memory cells as compared to a control gate line. In a particular embodiment, a select gate line may be electrically connected to one row or one column of memory cells, and the control gate line may be electrically connected to two rows or two columns of memory cells. In another embodiment, a similar relationship may exist for bit lines. In still another embodiment, a select gate line and a control gate line may be substantially perpendicular to each other. The select gate line may be electrically connected to a different number of rows or columns of memory cells as compared to the control gate line. In a particular embodiment, a select gate line may be electrically connected to one row or one column of memory cells, and the control gate line may be electrically connected to two columns or two rows of memory cells.

Before addressing details of embodiments described below, some terms are defined or clarified. The term "discontinuous storage elements" is intended to mean spaced-apart objects capable of storing a charge. In one embodiment, substantially all discontinuous storage elements may be initially formed and remain separate from one another. In another embodiment, a substantially continuous layer of material formed an later separated into discontinuous storage elements. In yet another embodiment, substantially all discontinuous storage elements may be initially formed separate from one another, and later during the formation, some but not all of the discontinuous storage elements may coalesce.

The term "primary surface" is intended to mean a surface of a substrate from which memory cells within a memory array are subsequently formed. The primary surface may be an original surface of a substrate before forming any electronic components or may be a surface from which trenches or other permanent structures within the memory array are formed. For example, the memory array may be formed at least partly within an epitaxial layer overlying a base material, and electronic components within peripheral area (outside the memory array) may be formed from the base material. In this example, the primary surface refers to the upper surface of the epitaxial layer, and not the original surface of the base material.

The term "stack" is intended to mean a plurality of layers or a plurality of at least one layer and at least one structure (e.g., nanocrystals), wherein the plurality of layers or plurality of layer(s) and structure(s) provides an electronic function. For example, a non-volatile memory stack can include layers used to form at least part of a non-volatile memory cell. A stack may be part of a larger stack. For example, a non-volatile memory stack can include a charge storage stack that is used to store charge within a non-volatile memory cell.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

FIG. 1 includes a cross-sectional view of a portion of electronic device 10, such as an integrated circuit. The integrated circuit can be a standalone memory, a microcontroller, or other integrated circuit that includes a memory. In one embodiment, electronic device 10 can include non-volatile memory ("NVM") array 18, a portion of which is illustrated in FIG. 1. Substrate 12 can include a monocrystalline semiconductor wafer, a semiconductor-on-insulator wafer, a flat panel display (e.g., a silicon layer over a glass plate), or other substrate conventionally used to form electronic devices. Although not illustrated, shallow trench field isolation may be formed over portions of substrate 12 in peripheral areas, which are outside NVM array 18. Optionally, the doping concentration of substrate 12 along primary surface 13 within NVM array 18 can be increased using a conventional doping operation to potentially reduce leakage current between subsequently-formed gate electrodes that may overlie portions of primary surface 13. Protective layer 110 can be formed over substrate 12. Protective layer 110 can include pad layer 14, overlying substrate 12 and oxidation-resistant layer 16, over pad layer 14. Protective layer 110 could have more or fewer layers than are illustrated. The upper most surface of substrate 12, illustrated as contacting pad layer 14, is primary surface 13. Protective layer 110 can remain over the peripheral areas until fabrication of NVM array 18 is substantially completed. In one embodiment, pad layer 14 includes oxide, and oxidation-resistant layer 16 includes nitride.

Figure 2:
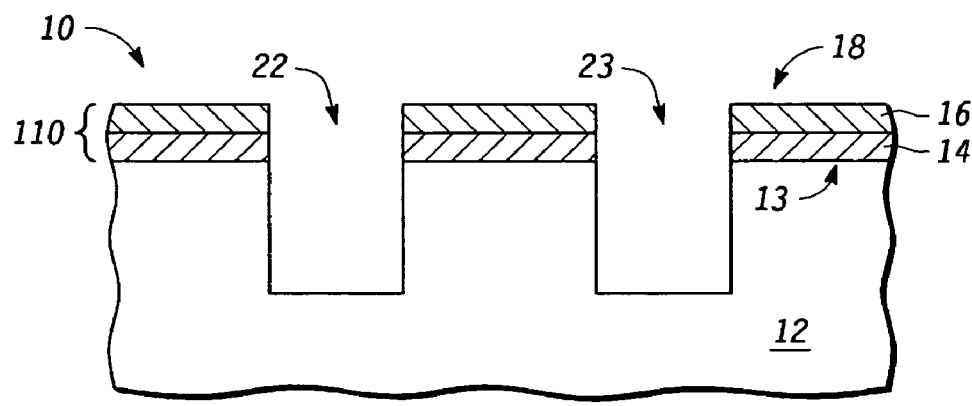
FIG. 2 includes an illustration of a cross-sectional view of the workpiece of FIG. 1 after formation of trenches.

A patterned resist layer (not illustrated), which includes openings at locations within NVM array 18 where trenches are to be formed, is formed over substrate 12 by a conventional technique. Exposed portions of protective layer 110 can then be removed by a conventional technique to expose primary surface 13. In one embodiment, trenches 22 and 23, as illustrated in FIG. 2, are formed prior to removal of the patterned resist layer. In another embodiment, the patterned resist layer is then removed, and trenches 22 and 23 can then be formed by a conventional technique. Trenches 22 and 23 are spaced apart from each other, extend from primary surface 13, and include walls and bottoms. The depth of trenches 22 and 23 can, at least in part, determine the channel length of one or more of the memory cells being formed adjacent to trenches 22 and 23. In one embodiment, the depths of trenches 22 and 23 are in a range of approximately 50 to approximately 500 nm. In one particular embodiment, trenches 22 and 23 are formed using a timed anisotropic etch to produce substantially vertical walls. In one embodiment, trenches 22 and 23 have substantially uniform depths.

Figure 3:
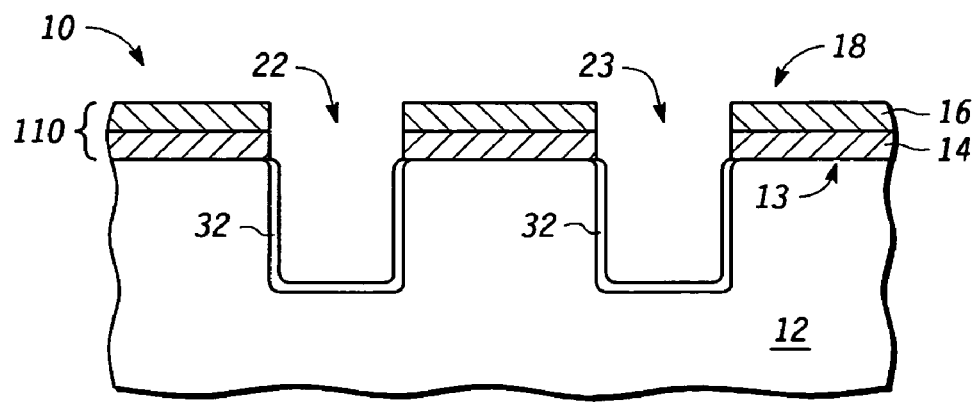
FIG. 3 includes an illustration of a cross-sectional view of a workpiece of FIG. 2 after formation of an insulating layer within the trenches.

Insulating layer 32 is formed along the exposed surfaces of trenches 22 and 23, as illustrated in FIG. 3. Insulating layer 32 may or may not be substantially conformal. In one embodiment, insulating layer 32 may include an oxide, a nitride, an oxynitride, or a combination thereof. In one embodiment, insulating layer 32 can be used as an implant screen. In one particular embodiment, insulating layer 32 is formed by thermally oxidizing the exposed portions of substrate 12 within trenches 22 and 23. Thermal oxidation can be beneficial in removing defects, such as those induced by etching, help to round corners of trenches 22 and 23, or a combination thereof. In another embodiment (not illustrated), insulating layer 32 can be deposited. A deposited insulating layer 32 would cover substantially all exposed surfaces of the workpiece.

Figure 4:
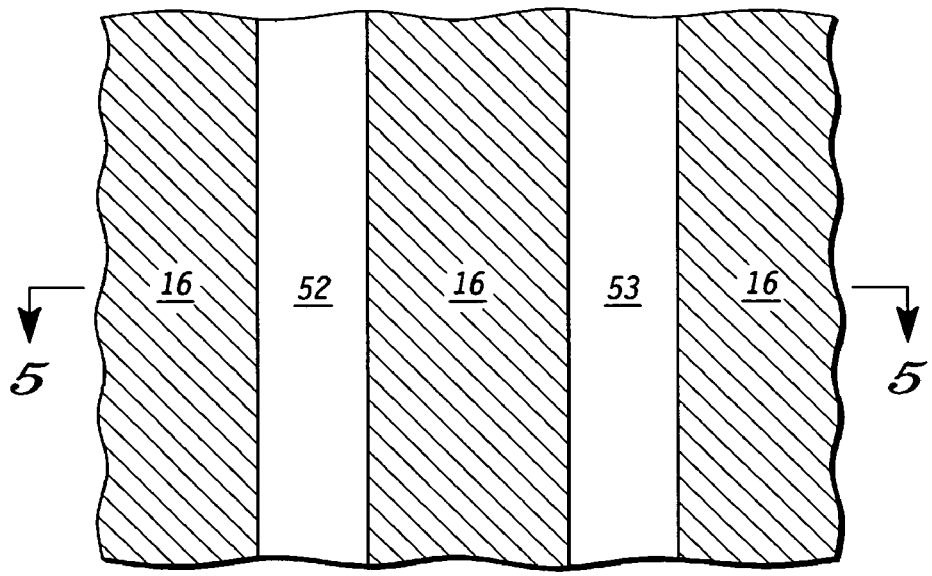
FIGS. 4 and 5 include illustrations of a top view and a cross-sectional view, respectively, of the workpiece of FIG. 3 after formation of doped regions at the bottom the trenches.
Figure 5:
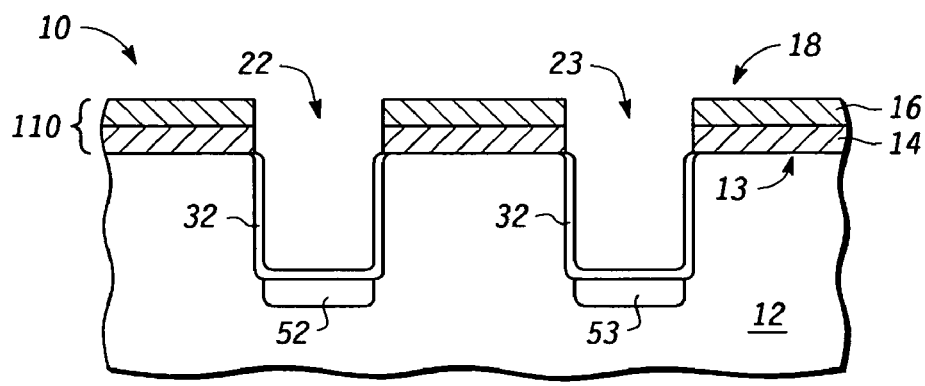

A dopant is introduced into portions of substrate 12 at the bottom of trenches 22 and 23 to form doped regions 52 and 53, as illustrated in top and cross-sectional views, in FIGS. 4 and 5, respectively. Doped region 52 lies within substrate 12 and below trench 22, and doped region 53 lies within substrate 12 and below trench 23. Doped regions 52 and 53 can be source/drain ("S/D") regions and act as buried bit lines. The dopant may be a p-type dopant (e.g., boron) or an n-type dopant (e.g., phosphorus or arsenic). In one embodiment, the dopant can be introduced using ion implantation. An optional thermal cycle can be performed to activate the dopant. In another embodiment, subsequent processing may have one or more thermal cycles capable of activating the dopant. At the bottom of trenches 22 and 23, the doping concentration of doped regions 52 and 53 is at least approximately 1E19 atoms/cm$^3$.

Figure 6:
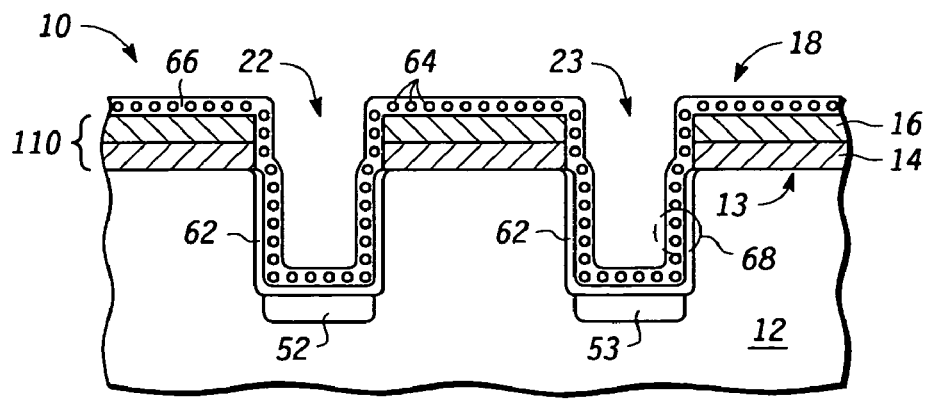
FIG. 6 includes an illustration of a cross-sectional view of the workpiece of FIG. 5 after formation of a charge storage stack including discontinuous storage elements.

Charge storage stack 68, including dielectric layer 62, discontinuous storage elements 64, and dielectric layer 66, can then be formed, as illustrated in FIG. 6. In one embodiment, insulating layer 32 can be removed prior to formation of dielectric layer 62 over the exposed surface of trenches 22 and 23, including the walls and bottoms of trenches 22 and 23. In another embodiment, insulating layer 32 is used in place of or in conjunction with dielectric layer 62. Dielectric layer 62 may be thermally grown using an oxidizing or nitridizing ambient, or deposited using a conventional chemical vapor deposition technique, physical vapor deposition technique, atomic layer deposition technique, or a combination thereof. If dielectric layer 62 is thermally grown, it is not formed outside the trenches in NVM array 18. If dielectric layer 62 is deposited (not illustrated), it can be deposited over substantially all of the exposed surfaces of the workpiece. Dielectric layer 62 can include one or more films of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_b$-$O_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. Dielectric layer 62 has a thickness in a range of approximately 1 to approximately 10 nm. The thickness and material selection of dielectric layer 62 will substantially determine its electrical properties. In one embodiment the thickness and material are chosen such that dielectric layer 62 has a silicon dioxide equivalent thickness of less than 10 nm.

Discontinuous storage elements 64 are then formed over NVM array 18. In one embodiment, one portion of discontinuous storage elements 64 lie at least within trench 22, and another portion of discontinuous storage elements 64 lie at least within trench 23. The individual discontinuous storage elements 64 are substantially physically separated from each other. Discontinuous storage elements 64 can include a material capable of storing a charge, such as silicon, a nitride, a metal-containing material, another suitable material capable of storing charge, or any combination thereof. For example, discontinuous storage elements 64 can include silicon nanocrystals or metal nanoclusters. In one particular embodiment, a substantially continuous layer of amorphous silicon can be formed over exposed surfaces of substrate 12. The substantially continuous layer can be exposed to heat or other processing conditions that can cause the layer to "ball up" or otherwise form silicon nanocrystals. Discontinuous storage elements 64 may be undoped, doped during deposition, or doped after deposition. In one embodiment, discontinuous storage elements 64 can be formed from one or more materials whose properties are not significantly adversely affected during a thermal oxidation process. Such a material can include platinum, palladium, iridium, osmium, ruthenium, rhenium, indium-tin, indium-zinc, aluminum-tin, or any combination thereof. Each of such materials, other than platinum and palladium, may form a conductive metal oxide. In one embodiment, each of discontinuous storage elements 64 is no greater than approximately 10 nm in any dimension. In another embodiment, discontinuous storage elements 64 can be larger, however, discontinuous storage elements 64 are not formed so large as to form a continuous structure (i.e., all discontinuous storage elements 64 are not fused together).

Dielectric layer 66 is then formed over discontinuous storage elements 64. Dielectric layer 66 can include one or more dielectric films, any of which may be thermally grown or deposited. Dielectric layer 66 can include any one or more materials or be formed using any of the embodiments as described with respect to dielectric 62 layer. Dielectric layer 66 can have the same or different composition compared to dielectric 62 layer and may be formed using the same or different formation technique compared to dielectric layer 62.

Figure 7:
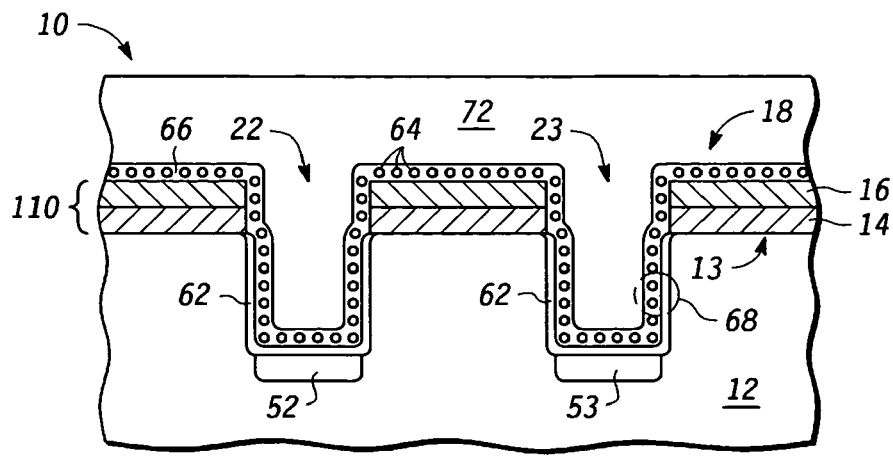
FIG. 7 includes an illustration of a cross-sectional view of the workpiece of FIG. 6 after formation of a conductive layer over the substrate.

Conductive layer 72 is then formed overlying the workpiece, as illustrated in FIG. 7. Conductive layer 72 can include one or more semiconductor-containing or metal-containing films. In one embodiment, conductive layer 72 includes polysilicon or amorphous silicon deposited by a chemical vapor deposition process. In another embodiment, conductive layer 72 may include one or more other materials or may be deposited by another process. In one particular embodiment, conductive layer 72 is doped when deposited, and in another particular embodiment, is doped after it is deposited. The thickness of conductive layer 72 is sufficient to at least substantially fill in the trenches within NVM array 18. In one embodiment, the thickness of conductive layer 72 is in a range of approximately 50 to approximately 500 nm, and in a finished device, remaining portions of conductive layer 72 have a dopant concentration of at least $1E19$ atoms/cm$^3$ when conductive layer 72 includes polysilicon or amorphous silicon.

Figure 8:
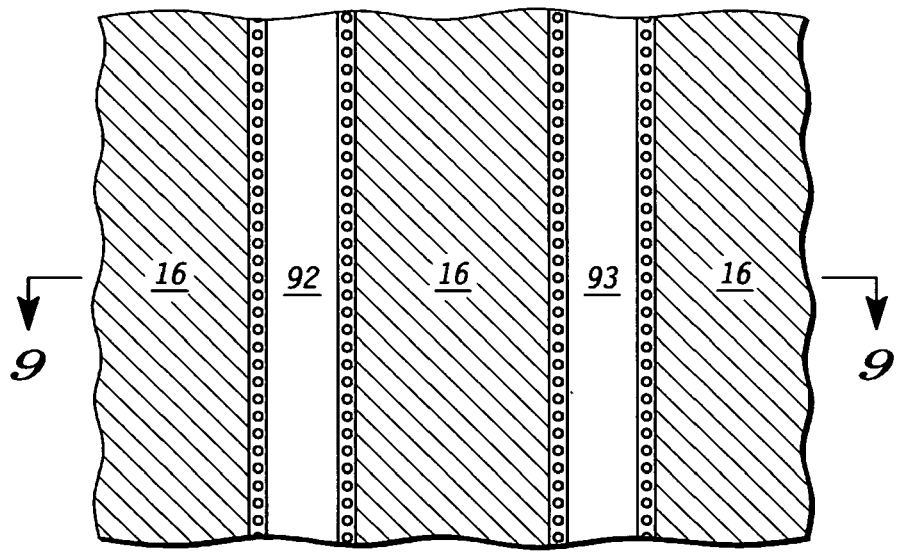
FIGS. 8 and 9 include illustrations of a top view and a cross-sectional view, respectively, of the workpiece in FIG. 7 after formation of gate electrodes.
Figure 9:
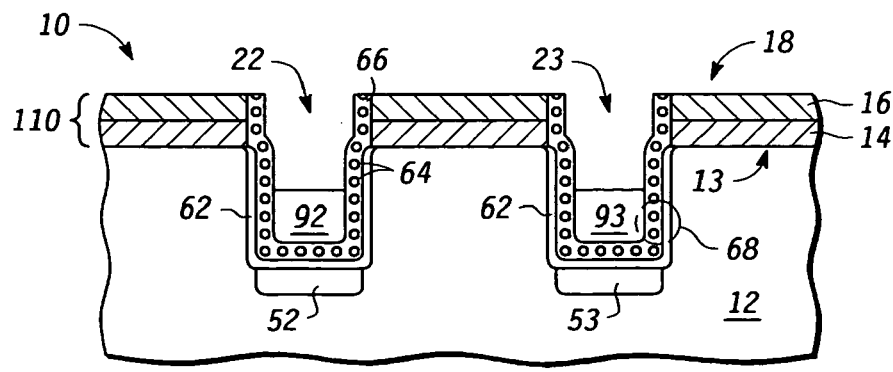

Portions of conducting layer 72 overlying primary surface 13 and lying outside trenches 22 and 23 can be removed, as illustrated in FIGS. 8 and 9. In FIG. 8 and other top views, some dielectric or insulating layers are not illustrated to simplify understanding of positional relationships between features within NVM array 18. Additional portions of conductive layer 72 are removed such that the remaining material is recessed below primary surface 13 and contained within trenches 22 and 23 to form gate electrodes 92 and 93, each of which has an upper surface that lies below primary surface 13. Gate electrode 92 overlies one portion of discontinuous storage elements 64 within trench 22, and gate electrode 93 overlies another portion of discontinuous storage elements 64 within trench 23. In one embodiment, each of gate electrodes 92 and 93 has a substantially rectangular shape, as seen from a cross-sectional view. In one particular embodiment, conductive layer 72 is undoped polysilicon, as initially deposited. Gate electrodes 92 and 93 are then doped by conventional techniques such that in a finished device, gate electrodes 92 and 93 have a concentration of at least $1E19$ atoms/cm$^3$. In another embodiment, a material capable of reacting with silicon to form a silicide, and can include Ti, Ta, Co, W, Mo, Zr, Pt, other suitable material, or any combination thereof is formed on gate electrodes 92 and 93 and reacted to form a metal silicide.

In one particular embodiment, removal of a portion of conductive layer 72 is accomplished by polishing with a conventional technique to expose oxidation-resistant layer 16, followed by a timed etch. In another embodiment (not illustrated), the removal is accomplished by an etch process without polishing. In another embodiment the recess, which is the elevational difference between the primary surface 13 and the tops of the gate electrodes 92 and 93, is between 20% and 80% of the depth of trenches 22 and 23.

Figure 10:
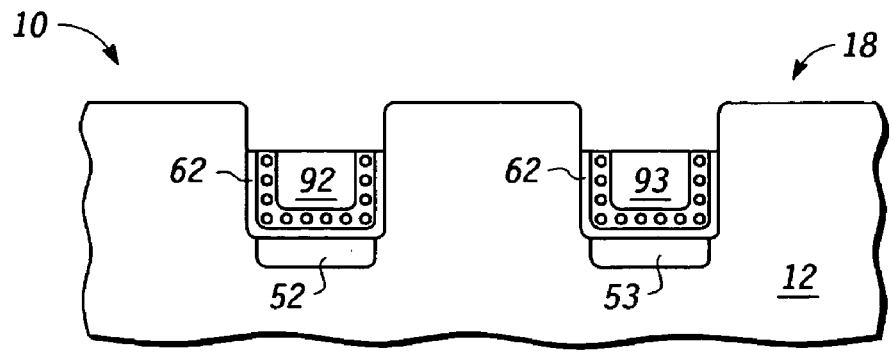
FIG. 10 includes an illustration of a cross-sectional view of the workpiece of FIG. 9 after removal of the remaining portions of the protective layer within the array, and exposed portions of the charge storage stack.

Remaining portions of protective layer 110 within NVM array 18 are removed by conventional technique as illustrated in FIG. 10. In one embodiment, pad layer 14 is an oxide layer removed by a wet etch that undercuts discontinuous storage elements 64, allowing them to be rinsed away. In another embodiment (not illustrated), exposed portions of dielectric layer 66 are removed, exposing discontinuous storage elements 64, which can then undergo additional processing to change them from electrically conducting to electrically insulating. In one particular embodiment, discontinuous storage elements 64 are silicon crystals that are oxidized to form silicon dioxide. In one embodiment, at this point in the process, substantially no discontinuous storage elements 64 overlie primary surface 13 or along walls of trenches 22 and 23 that lie above the tops of gate electrodes 22 and 23.

Figure 11:
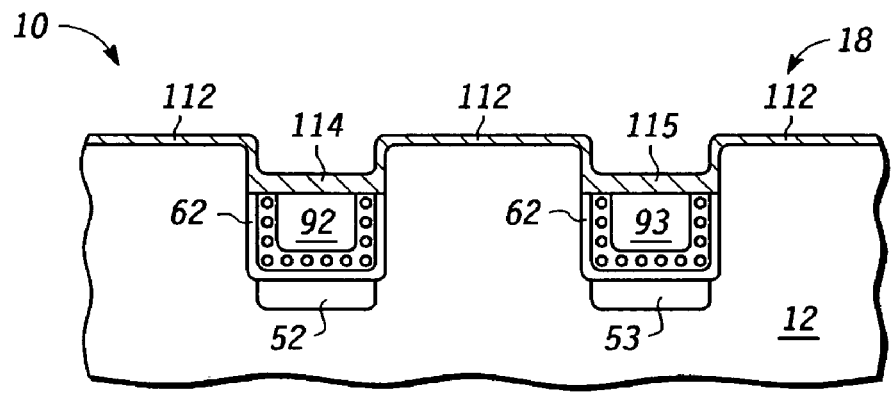
FIG. 11 includes an illustration of a cross-sectional view of the workpiece of FIG. 10 after formation of an insulating layer.

An insulating layer including gate dielectric portions 112 and intergate dielectric portions 114 and 115 is then formed over NVM array 18, as illustrated in FIG. 11. The insulating layer can include one or more dielectric films, any of which may be thermally grown or deposited. The insulating layer can include any one or more materials or be formed using any of the embodiments as described with respect to dielectric 62 layer. The insulating layer can have the same or different composition compared to dielectric 62 layer and may be formed using the same or different formation technique compared to dielectric layer 62. The thickness of intergate dielectric portions 114 and 115 can affect the electrical fields within the channel regions of the memory cells. The electrical field is designed to provide the highest change in electrical field within the channel region for each memory cell to allow for source-side injection. In one embodiment, the thickness of intergate dielectric portions 114 and 115 is in a range of approximately 10 to approximately 30 nm.

Figure 12:
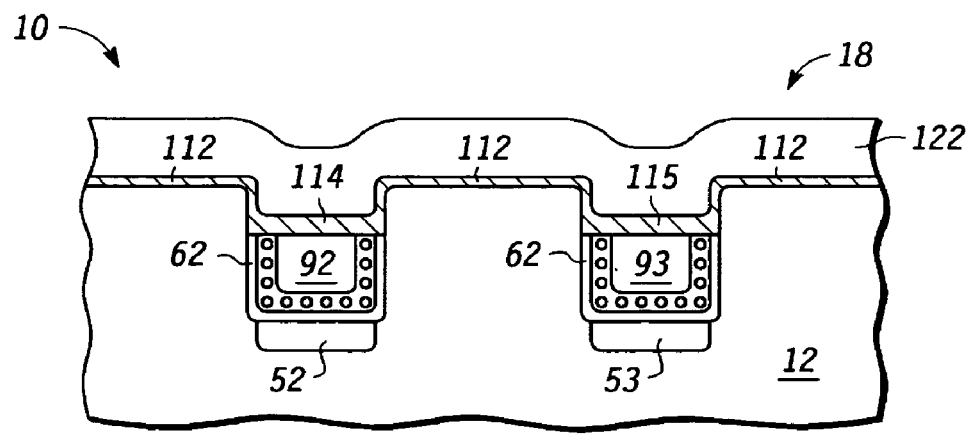
FIG. 12 includes an illustration of a cross-sectional view of the workpiece of FIG. 11 after formation of a conductive layer.

Conductive layer 122 is formed over NVM array 18, as illustrated in FIG. 12. Conductive layer 122 can include one or more semiconductor-containing or metal-containing films. In one embodiment, conductive layer 122 is doped polysilicon. In another embodiment, conductive layer 122 is formed from a metal containing material. In one embodiment, the thickness of conductive layer 122 is in a range of approximately 20 to approximately 300 nm. In another embodiment, conductive layer 122 has a dopant concentration of at least approximately 1E19 atoms/cm$^3$ when conductive layer 122 includes polysilicon or amorphous silicon.

Figure 13:
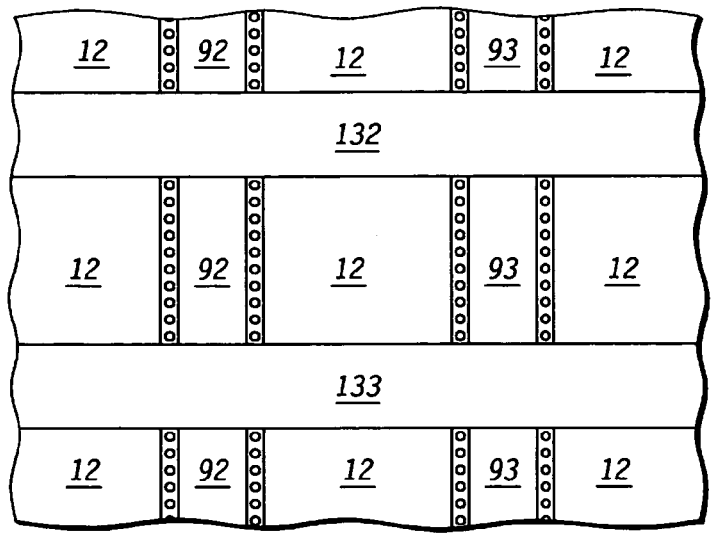
FIG. 13 includes an illustration of a top view of the workpiece of FIG. 12 after formation of conducting lines.

Conductive layer 122 is patterned by etching using a conventional technique to form conductive lines 132 and 133, which include gate electrodes, as illustrated in FIG. 13. Conductive lines 132 and 133 can lie at least partly within trench 22, trench 23, one or more other trenches (not illustrated) within NVM array 18, or any combination thereof. In one embodiment, the lengths of conductive lines 132 and 133 are substantially perpendicular to the lengths of trenches 22 and 23 within NVM array 18. Optionally, a material capable of reacting with silicon to form a silicide (e.g., Ti, Ta, Co, W, Mo, Zr, Pt, other suitable material, or any combination thereof) is formed on conductive line 132 and 133 and reacted to form a metal silicide. In another embodiment, conductive lines 132 and 133 can be used as word lines for NVM array 18, with portions thereof acting as gate electrodes for plurality of bit cells. Optionally, sidewall spacers may be formed adjacent to conductive lines 132 and 133.

In one embodiment, NVM array 18 is substantially complete. In one embodiment, peripheral electrical connections (not illustrated) are made to access conductive portions of NVM array 18. Protective layer 110 overlying the peripheral areas of substrate 12 can be removed, and another protective layer (not illustrated) can be formed over NVM array 18, which may protect NVM array 18 during component fabrication within the peripheral areas. Processing can be continued to form a substantially completed electronic device. One or more insulating layers, one or more conductive layers, and one or more encapsulating layers are formed using one or more conventional techniques.

In another embodiment, a different NVM array 18 layout and interconnect scheme may be used. In this embodiment, the process through formation of conductive layer 122 over all of NVM array 18 (FIG. 12) can be performed using any embodiment as previously described.

Figure 14:
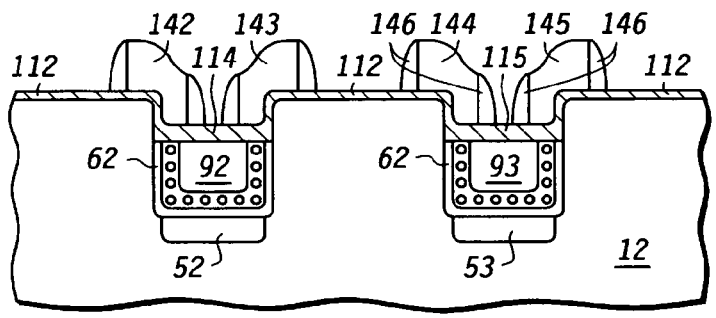
FIG. 14 includes an illustration of a cross-sectional view of the workpiece of FIG. 11 after formation of conductive lines in accordance with another embodiment.

Conductive layer 122 can be patterned and etched to form conductive lines 142 through 145, as illustrated in FIG. 14. The conductive lines 142 through 145 can act as word lines in the NVM array 18. The lengths of conductive lines 142 through 145 are substantially parallel to the lengths of trenches 22 and 23. In one embodiment, portions of conductive lines 142 through 145 can lie within the recesses of trenches 22 and 23. The composition and method of formation of conductive lines 142 through 145 may be any of those described with respect to formation of conductive lines 132 and 133. Optionally, sidewall spacers 146 may be formed adjacent to conductive lines 142 through 145.

Figure 15:
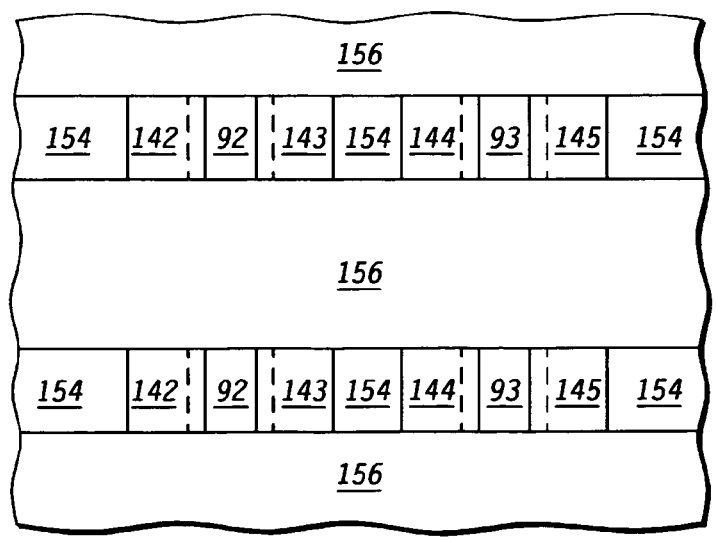
FIG. 15 includes an illustration of a top view of the workpiece of FIG. 14 after formation of a patterned resist layer.

Patterned resist layer 156, as illustrated in FIG. 15, is formed over the workpiece to expose portions of conductive lines 142 through 145 and parts of gate dielectric portions 112 (not illustrated in FIG. 15). In one embodiment, openings in patterned resist layer 156 substantially correspond to locations over which bit lines will subsequently be formed. A dopant is introduced into portions of substrate 12 to form doped regions 154, as illustrated in FIG. 15. The dopant may be a p-type dopant (e.g., boron) or an n-type dopant (e.g., phosphorus or arsenic). In one embodiment, the dopant can be introduced using ion implantation. Patterned resist layer 156 is then removed by a conventional technique. In one embodiment, the implanted dopant is activated by one or more subsequent thermal cycles, which may or may not serve a different primary purpose such as oxidation, deposition, annealing, drive or activation of a different implant dopant. In one embodiment, each of doped regions 154 has a dopant concentration of at least approximately 1E19 atoms/cm$^3$. In a particular embodiment, in a finished device, doped regions 154 serve as S/D regions.

In one embodiment, NVM array 18 is now substantially complete other than electrical connections. Remaining portions of protective layer 110 (not illustrated in FIG. 15) that overlie the peripheral areas of substrate 12 are removed, and another protective layer (not illustrated) can be formed over NVM array 18 which may protect NVM array 18 during component fabrication within the peripheral areas. Component fabrication within the peripheral areas can be performed using one or more conventional techniques. After the component fabrication within the peripheral areas is substantially completed, the protective layer overlying NVM array 18 can be removed.

Figure 16:
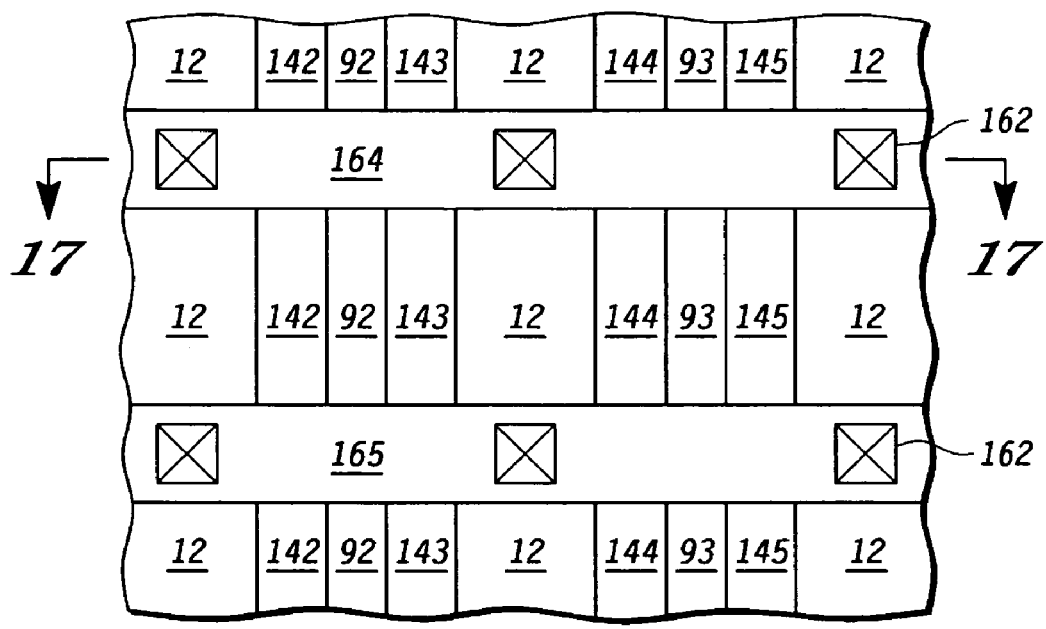
FIGS. 16 and 17 include illustrations of a top view and a cross-sectional view, respectively, of the workpiece of FIG. 15 after fabrication of an electronic device is substantially completed.
Figure 17:
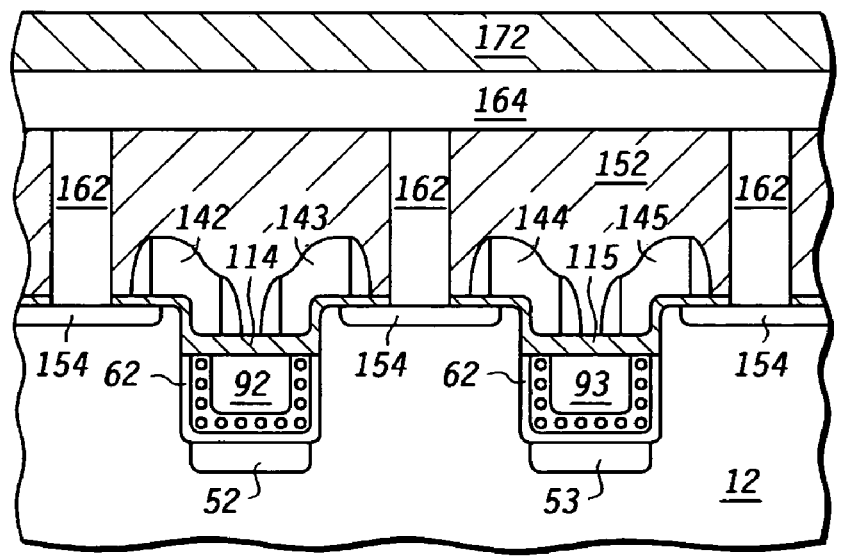

Processing is continued to form the substantially completed electronic device, as illustrated in FIGS. 16 and 17. Referring to FIG. 17, an interlevel dielectric layer 152 is formed over the workpiece by a conventional technique. Interlevel dielectric layer 152 is patterned to form contact openings that extend to doped regions 154 and to other portions of NVM array 18 that are not illustrated in FIGS. 16 and 17. Interlevel dielectric layer 152 can include an insulating material, such as an oxide, a nitride, an oxynitride, or a combination thereof. In a specific embodiment, an anisotropic etch can be used to form contact openings.

Conductive plugs 162 and conductive lines 164 and 165 are then formed. The lengths of conductive lines 164 and 165 are substantially perpendicular to the lengths of conductive lines 142 through 145, as illustrated in FIG. 16. In one embodiment, conductive lines 164 and 165 are bit lines for NVM array 18, and conductive plugs 162 are bit line contacts. Referring to FIG. 16, portions of substrate 12 are illustrated lying between conductive lines 164 and 165. Although not illustrated in FIG. 16, doped regions 154 underlie conductive lines 164 and 165 between the portions of substrate 12.

In one embodiment, conductive plugs 162 are formed prior to conductive lines 164 and 165. In one particular embodiment, a conductive layer (not illustrated) is formed over interlevel dielectric layer 152 and substantially fills contact openings therein. Portions of the conductive layer that lie outside the contact openings are removed to form conductive plugs 162. In one embodiment, a conventional chemical-mechanical polishing operation can be performed, and in another embodiment, a conventional etching process can be performed.

Another insulating layer (not illustrated) is then deposited and patterned to form trenches where conductive lines 164 and 165 will subsequently be formed. Other trenches can be formed at locations within NVM array 18, outside NVM array 18, or a combination thereof. In one embodiment, another conductive layer is formed over interlevel dielectric layer 152 and substantially fills the trenches in the insulating layer. Portions of the conductive layer that lie outside the trenches within the insulating layer are removed to form conductive lines 164 and 165. In one embodiment, a conventional chemical-mechanical polishing operation can be performed, and in another embodiment, a conventional etching process can be performed. Although not illustrated in FIGS. 16 and 17, the insulating layer can lie at substantially the same elevation between conductive lines 164 and 165. In another embodiment (not illustrated), conductive plugs 162 and conductive lines 164 and 165 are formed concurrently using a conventional dual-inlaid process.

Conductive plugs 162 and conductive lines 164 and 165 can include the same or different conducting materials. Each of conductive plugs 162 and conductive lines 164 and 165 can include doped silicon, tungsten, titanium, tantalum, titanium nitride, tantalum nitride, aluminum, copper, another suitable conductive material, or any combination thereof. In one particular embodiment, conductive plugs 162 include tungsten, and conductive lines 164 and 165 include copper. An optional barrier layer, adhesion layer, or a combination thereof may be formed before the corresponding conductive layers (e.g., tungsten for conductive plugs 162 and copper for conductive lines 164 and 165). An optional capping layer (e.g., a metal-containing nitride) may be used to encapsulate copper within conductive lines 164 and 165.

In another embodiment (not illustrated), additional insulating and conductive layers can be formed and patterned to form one or more additional levels of interconnects. After the last interconnect level has been formed, passivation layer 172 is formed over substrate 12, including NVM array 18 and peripheral areas. Passivation layer 172 can include one or more insulating film, such as an oxide, a nitride, an oxynitride, or a combination thereof.

In another embodiment, yet another NVM array 18 layout and interconnect scheme may be used. In this embodiment, the process through formation of conductive lines 132 and 133 (FIG. 13) can be performed using any embodiment as previously described with respect to FIGS. 1 to 13. In one embodiment, remaining portions (not illustrated) of protective layer 110 that overlie the peripheral areas of substrate 12 are removed, and another protective layer (not illustrated) can be formed over NVM array 18 which may protect NVM array 18 during component fabrication within the peripheral areas. Component fabrication within the peripheral areas can be performed using one or more conventional techniques. After the component fabrication within the peripheral areas is substantially completed, the protective layer overlying NVM array 18 can be removed.

Figure 18:
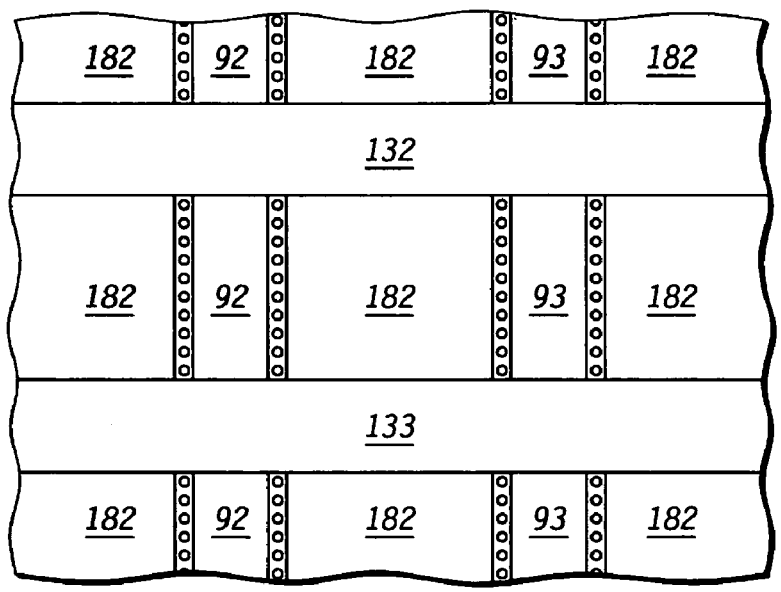
FIG. 18 includes an illustration of a top view of the workpiece of FIG. 13 after formation of doped regions within the substrate.

In one embodiment, the remainder of processing for the peripheral areas and NVM array 18 can occur substantially simultaneously. After forming conductive lines 132 and 133 and other conductive lines that include gate electrodes in NVM array 18 and peripheral areas, a dopant is introduced into substrate 12 to form doped regions 182 at locations between conductive lines 132 and 133 and outside and adjacent to trenches 22 and 23, as illustrated in FIG. 18. Doped regions 182 can include any one or more materials or be formed using any of the embodiments as described with respect to doped regions 154. Doped regions 182 can have the same or different composition compared to doped regions 154 and may be formed using the same or different formation technique compared to doped regions 154. Optionally, spacers (not illustrated) may be formed adjacent to conductive lines 132 and 133 before, after, or between individual actions used in forming doped regions 182. In one specific embodiment, the optional sidewall spacers can be formed as previously described regarding other embodiments. In one embodiment, doped regions 182 can serve as S/D regions in the finished device. In a particular embodiment, each of doped regions 182 has a dopant concentration of at least approximately $1E19$ atoms/cm$^3$. Optionally, a metal silicide can be formed from portions of conductive lines 132 and 133 and doped regions 182 using a conventional technique.

Figure 19:
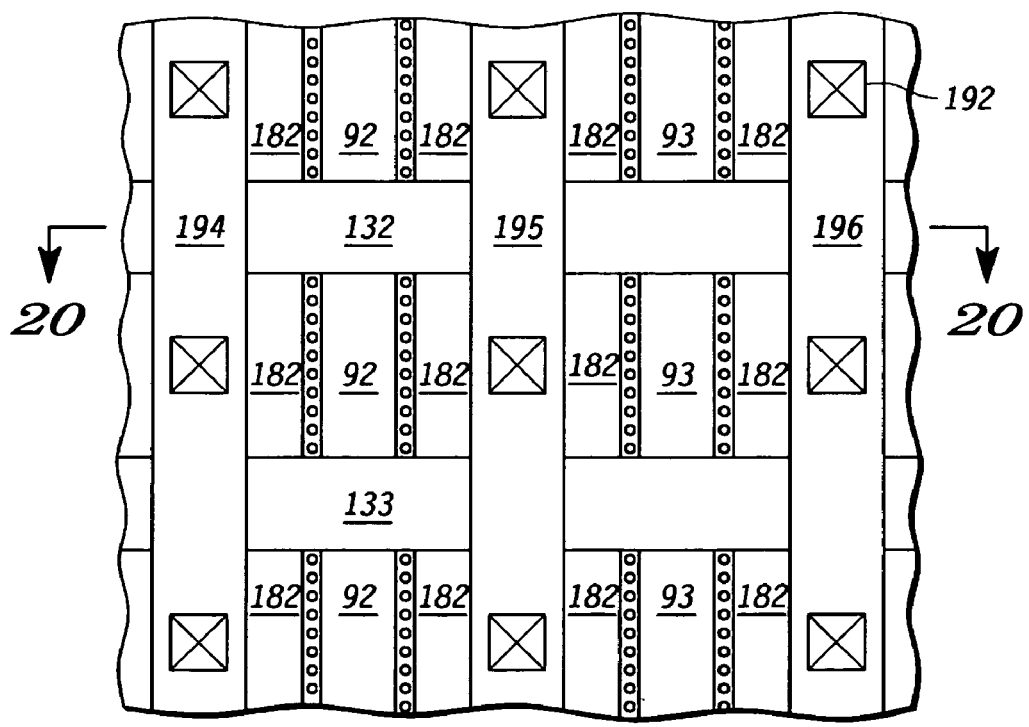
FIGS. 19 and 20 include illustrations of a top view and a cross-sectional view, respectively, of the workpiece of FIG. 18 after fabrication of an electronic device is substantially completed.
Figure 20:
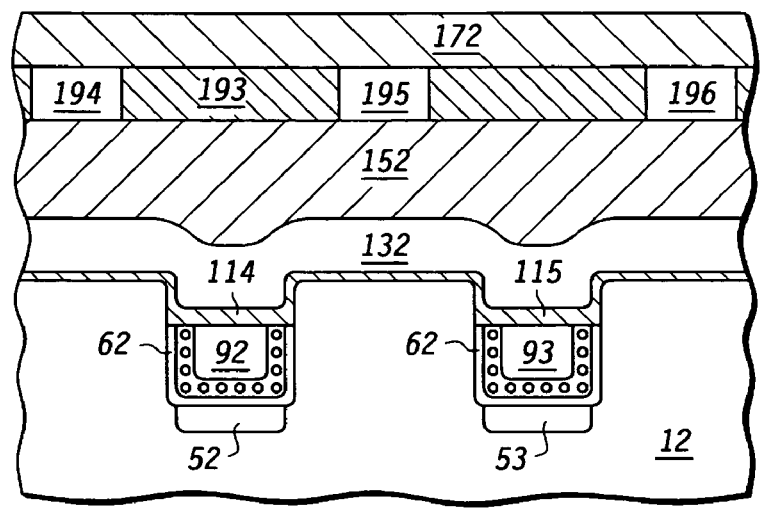

An interlevel dielectric layer 152 is then formed and patterned to form contact openings, as illustrated in FIGS. 19 and 20, using any of the embodiments as previously described with respect to formation and patterning of interlevel dielectric layer 152. The locations of the contact openings are changed as compared to a prior embodiment in that contact openings extend to doped regions 182.

Referring to FIGS. 19 and 20, interlevel dielectric layer 152 can be formed as previously described. Conductive plugs 192 are then formed using any embodiment as previously described for conductive plugs 162. The locations of conductive plugs 192 are different from those illustrated for conductive plugs 162.

Referring to FIGS. 19 and 20, insulating layer 193 is then deposited over interlevel dielectric layer 152 and conductive plugs 192 and patterned to form trenches where conductive lines 194 through 196 will subsequently be formed. Other trenches can be formed at locations within NVM array 18, outside NVM array 18, or a combination thereof. Conductive lines 194 through 196 are then formed using any embodiment as previously described for conductive lines 164 and 165. Conductive lines 194 through 196 can serve as bit lines within NVM array 18. The locations of conductive plugs 192 and conductive lines 194 through 196 are different from those illustrated for conductive plugs 162 and conductive lines 164 and 165, respectively. The orientation of conductive lines 194 through 196 is different from the orientation of conductive lines 164 and 165. The lengths of conductive lines 194 through 196 are substantially perpendicular to the lengths of conductive lines 132 and 133, as illustrated in FIG. 19.

In another embodiment (not illustrated), additional insulating and conductive layers can be formed and patterned to form additional levels of interconnects. After the last interconnect level has been formed, passivation layer 172 is formed over substrate 12, including NVM array 18 and peripheral areas. Passivation layer 172 can include one or more insulating film, such as an oxide, a nitride, an oxynitride, or a combination thereof.

In another embodiment, still another NVM array 18 layout and interconnect scheme may be used. The layout and interconnect scheme is similar to an embodiment as illustrated in FIGS. 1 through 13 and 18 through 20 except that a virtual ground array architecture is used, rather than conductive lines 194 through 196. The layout and organization will become more apparent after reading the description below with respect to FIGS. 21 to 25.

Figure 21:
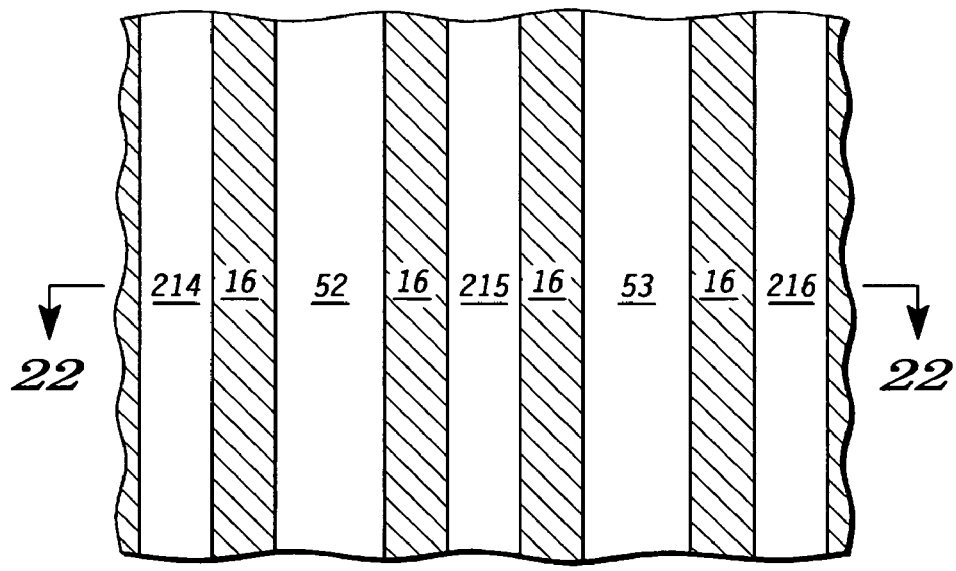
FIGS. 21 and 22 include illustrations of a top view and a cross-sectional view, respectively, of the workpiece of FIG. 13 after formation of doped regions within the substrate.
Figure 22:
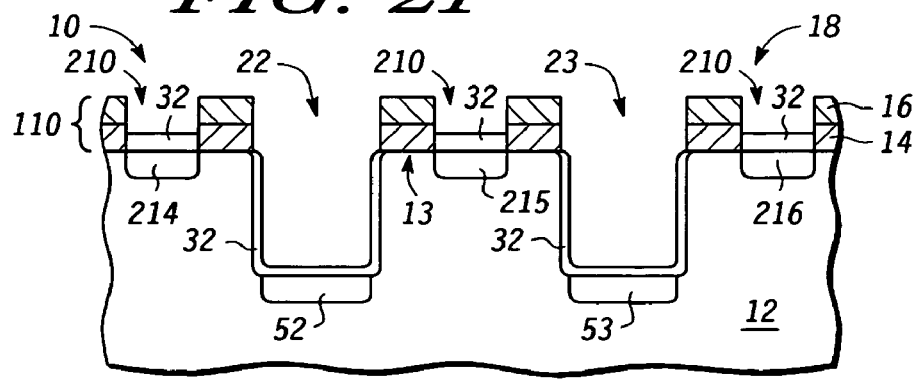

Relatively early in the process, openings 210 are formed within the protective layer 110, and doped regions 214, 215, and 216 are formed along primary substrate 13 of substrate 12 outside trenches 22 and 23, as illustrated in FIGS. 21 and 22, which are similar to FIGS. 4 and 5, respectively. Openings 210 and doped regions 214, 215, and 216 can be formed using one or more conventional techniques. Openings 210 can be formed before or after forming trenches 22 and 23. For example, all openings within protective layer 110 may be formed at substantially simultaneously. A mask (not illustrated) can be formed over opening 210 to substantially prevent forming a trench below openings 210. The mask can be removed after forming trenches 22 and 23. In another embodiment, a different mask (not illustrated) may be formed over openings 210 after trenches 22 and 23 have been formed, and the different mask can be removed after forming openings 210. Insulating layer 32 can be formed along the bottoms of openings 210 in a manner similar to the embodiment described with respect to FIG. 3.

Doped regions 214, 215, and 216 can be formed using any one or more of the embodiments as described with respect to doped regions 52 and 53. The dopant species, concentration, and profile and formation of doped regions 214, 215, and 216 may be the same or different as compared to doped regions 52 and 53. In one embodiment, doped regions 214, 215, and 216 can be formed substantially simultaneously with doped regions 52 and 53. Each of doped regions 52, 53, 214, 215, and 216 have lengths that are substantially parallel to one another and can act as buried bit lines. Doped regions 52 and 53 lie at elevations deeper within substrate 12, as compared to doped regions 214, 215, and 216.

In still another embodiment (not illustrated), openings 210 are not formed. Instead, after forming trenches 22 and 23, remaining portions of protective layer 110 within NVM array 18 are removed before forming insulating layer 32. Doped regions 214, 215, and 216 can be formed when doped regions 52 and 53 are formed. Doped regions 214, 215, and 216 can extend to walls of trenches 22 and 23.

Figure 23:
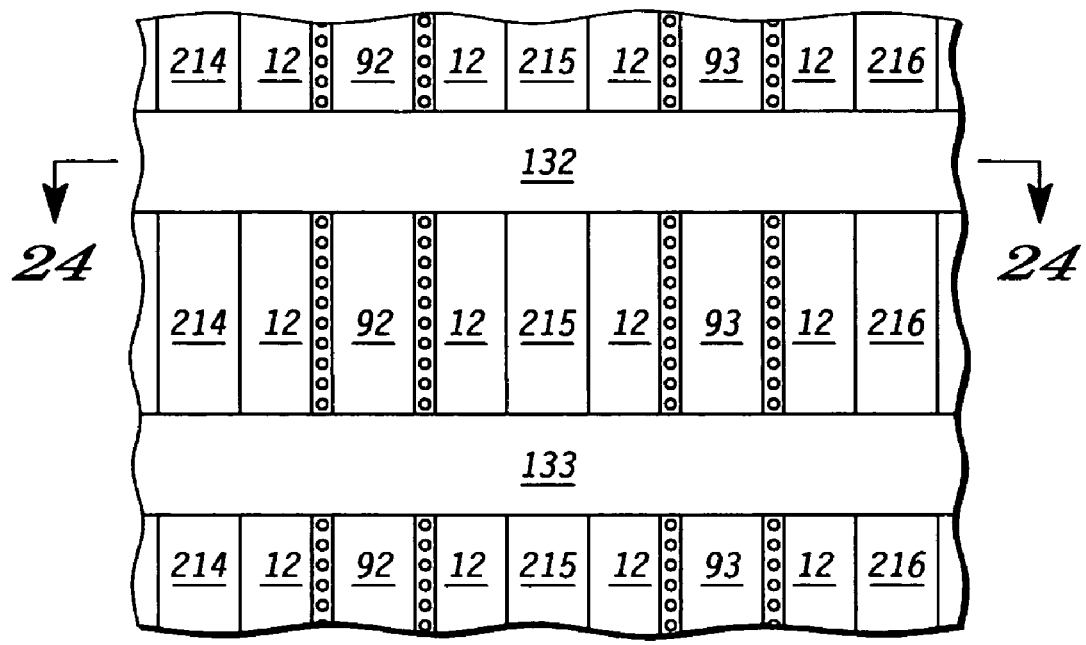
FIGS. 23 and 24 include illustrations of a top view and a cross-sectional view, respectively, of the workpiece of FIGS. 21 and 22 after fabrication of an electronic device is substantially completed.
Figure 24:
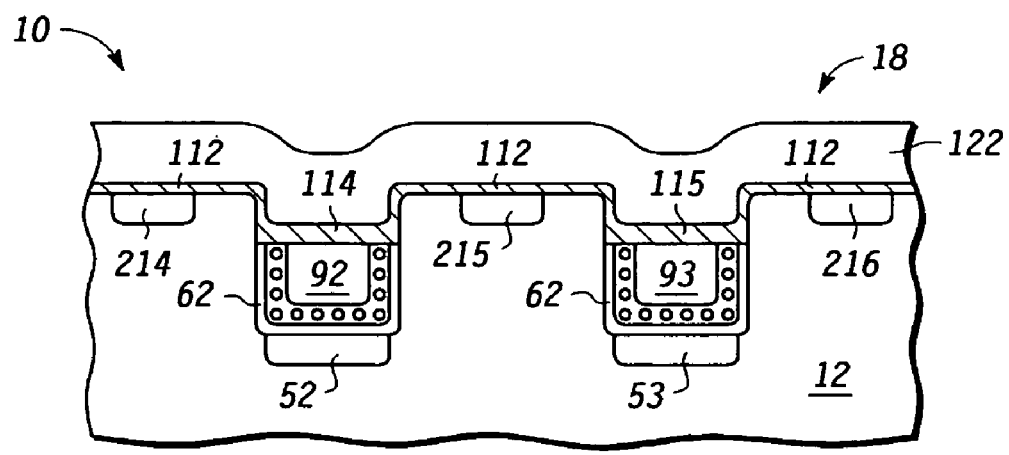

After doped regions 52, 53, 214, 215, and 216 are formed using any one or combination of embodiments described above, processing is continued using any one or more of the embodiments as described with respect to FIGS. 6 through 13. FIGS. 23 and 24 include illustrations of a portion of NVM array 18 are formation of the NVM array is substantially completed. As compared to the conductive lines 194 through 196 in FIGS. 19 and 20, doped regions 214 through 216 can be used in place of conductive lines 194 to 196.

In one embodiment, peripheral electrical connections (not illustrated) are made to access conductive portions of NVM array 18. Protective layer 110 overlying the peripheral areas of substrate 12 can be removed, and another protective layer (not illustrated) can be formed over NVM array 18, which may protect NVM array 18 during component fabrication within the peripheral areas. Processing can be continued to form a substantially completed electronic device. One or more insulating layers, one or more conductive layers, and one or more encapsulating layers are formed using one or more conventional techniques.

In another embodiment, still another NVM array 18 layout and interconnect scheme may be used. The layout and interconnect scheme is similar to an embodiment as illustrated in FIGS. 1 through 13 and 18 through 20 except that a plurality of bit lines lie between trenches 22 and 23, and electrical connections are made between the bit lines and only some of the doped regions under the bit lines. The layout and organization will become more apparent after reading the description below with respect to FIGS. 25 to 29.

Figure 25:
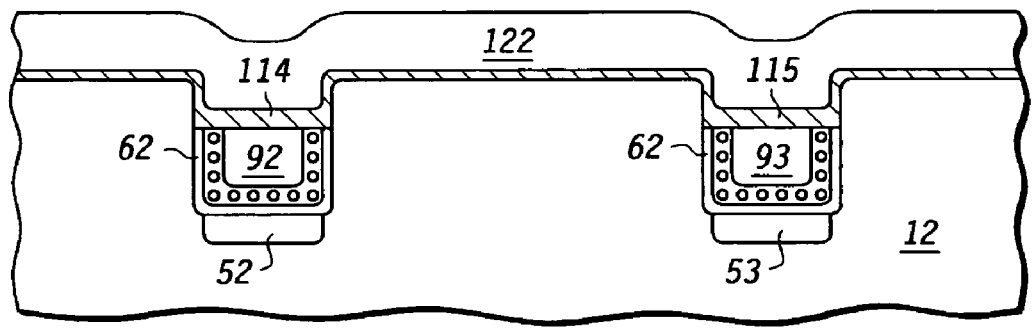
FIG. 25 includes an illustration of a cross-sectional view of the workpiece of FIG. 12 except with trenches that are more widely spaced apart from each other.

In this embodiment, the process through formation of conductive lines 132 and 133 (FIG. 13) can be performed using any embodiment as previously described with respect to FIGS. 1 through 13. In one embodiment, the space between trenches 22 and 23 may be increased to allow for the proper formation of bit lines and contacts consistent with the design rules, as illustrated in FIG. 25. In another embodiment, remaining portions (not illustrated) of protective layer 110 that overlie the peripheral areas of substrate 12 are removed, and another protective layer (not illustrated) can be formed over NVM array 18 which may protect NVM array 18 during component fabrication within the peripheral areas. Component fabrication within the peripheral areas can be performed using one or more conventional techniques. After the component fabrication within the peripheral areas is substantially completed, the protective layer overlying NVM array 18 can be removed.

Figure 26:
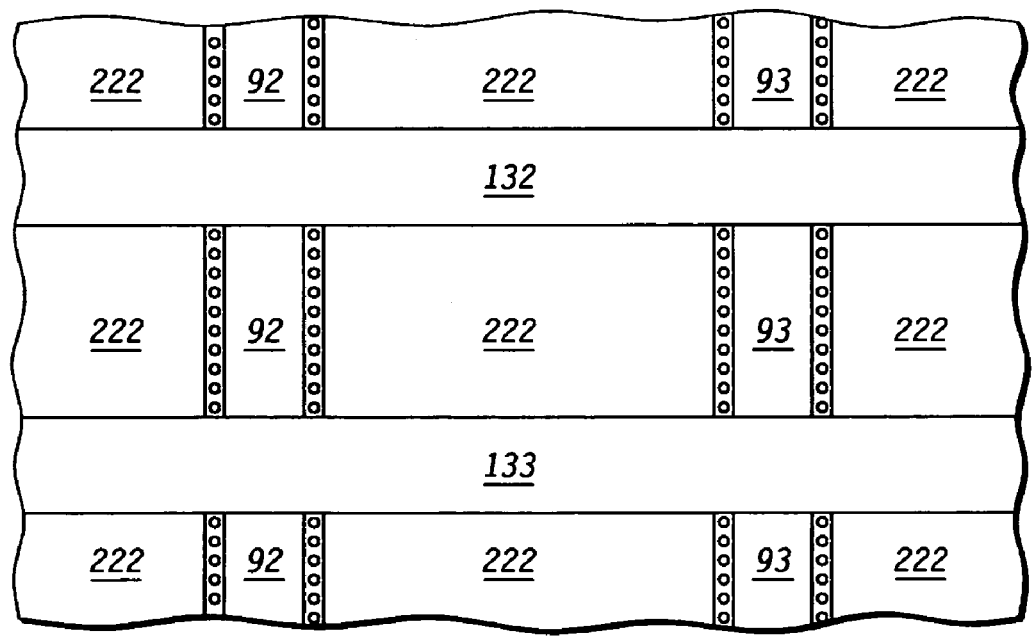
FIG. 26 includes an illustration of a top view of the workpiece of FIG. 25 after formation of overlying conducting lines.
Figure 27:
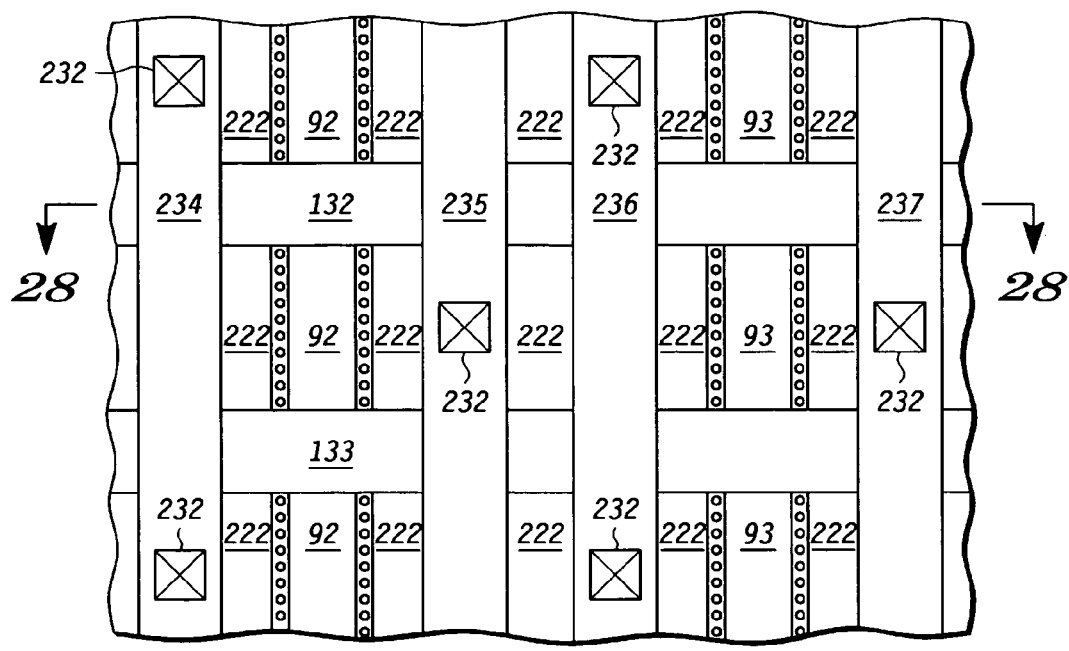
FIGS. 27 and 28 include illustrations of a top view and a cross-sectional view of the workpiece of FIG. 26 after fabrication of an electronic device is substantially completed.
Figure 28:
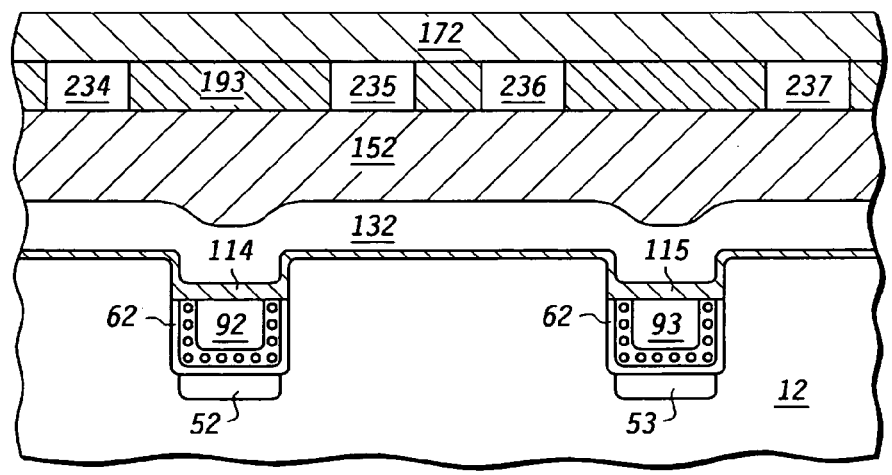

Formation of conductive lines 132 and 133 and doped regions 222, as illustrated in FIG. 26 can be performed using any one of the embodiments as described with respect to conductive lines 132 and 133 and doped regions 182, as illustrated in FIG. 18. An interlevel dielectric layer 152 is then formed and patterned to form contact openings, as illustrated in FIGS. 27 and 28, using any of the embodiments as previously described with respect to formation and patterning of interlevel dielectric layer 152. The locations of the contact openings are changed in that contact openings extend to doped regions 222.

Referring to FIGS. 27 and 28, conductive plugs 232 and conductive lines 234 through 237 are then formed using any embodiment as previously described for conductive plugs 192 and conductive lines 194 through 196. Conductive lines 234 through 237 can serve as bit lines within NVM array 18. The locations of conductive plugs 232 and conductive lines 234 through 237 are different from those illustrated for conductive plugs 192 and conductive lines 194 through 196, respectively. The orientation of conductive lines 234 through 237 is substantially the same as the orientation of conductive lines 194 through 196. The lengths of conductive lines 234 and 234 are substantially perpendicular to the lengths of conductive lines 132 and 133, as illustrated in FIG. 27. Unlike conductive lines 194 through 196, each of conductive lines 234 through 237 has electrical connections via conductive plugs 232 to only some of the underlying doped regions 222. In one particular embodiment, the electrical connections to underlying doped regions 222 are alternated between conductive lines 235 and 236. Referring to FIG. 27, conductive line 235 is electrically connected to the middle row of doped regions 222, and a conductive line 236 is electrically connected to the top and bottom rows of doped regions 222.

In another embodiment (not illustrated), additional insulating and conductive layers can be formed and patterned to form additional levels of interconnects. After the last interconnect level has been formed, passivation layer 172 is formed over substrate 12, including NVM array 18 and peripheral areas. Passivation layer 172 can include one or more insulating film, such as an oxide, a nitride, an oxynitride, or a combination thereof.

Figure 29:
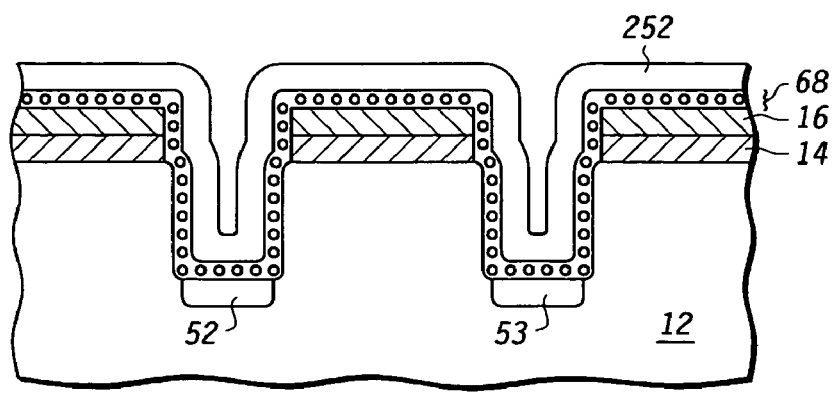
FIG. 29 includes an illustration of a cross-sectional view of the workpiece of FIG. 6 after formation of a conductive layer.

In another alternative embodiment, the gate electrodes within trenches 22 and 23 can have a shape similar to a sidewall spacer. The process may start with the workpiece as illustrated in FIG. 6. Conductive layer 252 can be deposited as illustrated in FIG. 29. In one embodiment, conductive layer 252 is a relatively thinner, substantially conformal layer. Conductive layer 252 can be formed using any one or more embodiments as described with respect to conductive layer 72. The thickness of conductive layer 252 is insufficient to fill in trench structure 22 and 23 within NVM array 18. In one embodiment, the thickness of conductive layer 252 is in a range of approximately 10 nm to approximately 100 nm.

Figure 30:
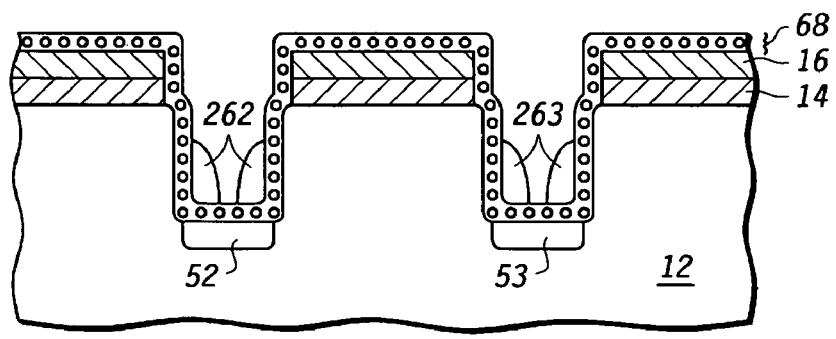
FIG. 30 includes an illustration of a cross-sectional view of the workpiece of FIG. 29 after formation of gate electrodes.

An anisotropic etch of conductive layer 252 can then form gate electrodes 262 and 263 illustrated in FIG. 30. When formed, gate electrodes 262 and 263 can have substantially sidewall spacer shapes within trenches 22 and 23. Although a top view is not illustrated, gate electrodes 262 and 263 are annular, in that each of gate electrodes 262 and 263 lies along the perimeter of trenches 22 and 23. Thus, the spaced-apart left and right portions with facing curved surfaces for each of gate electrodes 262 and 263 within each of trenches 22 and 23 are connected to each other. The processing of NVM array 18 can then be completed as previously described for other embodiments. In one embodiment, when conductive lines 132 and 133 are formed, an additional isotropic etch portion may be used to reduce the likelihood of forming an unintended electrical connection or leakage path between subsequently-formed conductive lines 132 and 133.

After reading this specification, skilled artisans will appreciate that many variations regarding doping portions of the substrate 12 can be used. Doped regions that are at least part of source/drain regions for the memory cells within NVM array 18 have an opposite conductivity type as compared to substrate 12. The portion of substrate 12 as illustrated in the figures may or may not lie within one or more well regions. Such well region(s) may be different from one or more other well regions within peripheral areas (outside NVM array 18). Other doping can be performed that may affect breakdown voltages, resistivity, threshold voltage, hot carrier generation, one or more other electrical characteristics, or any combination thereof. Skilled artisans will be able to form electronic devices having doping characteristics that meet their needs or desires.

NVM array 18 can include memory cells using any of the layouts as previously described. Circuit schematics and cross references to physical embodiments are described to illustrate better how memory cells within NVM array 18 can be electrically configured and programmed.

Figure 31:
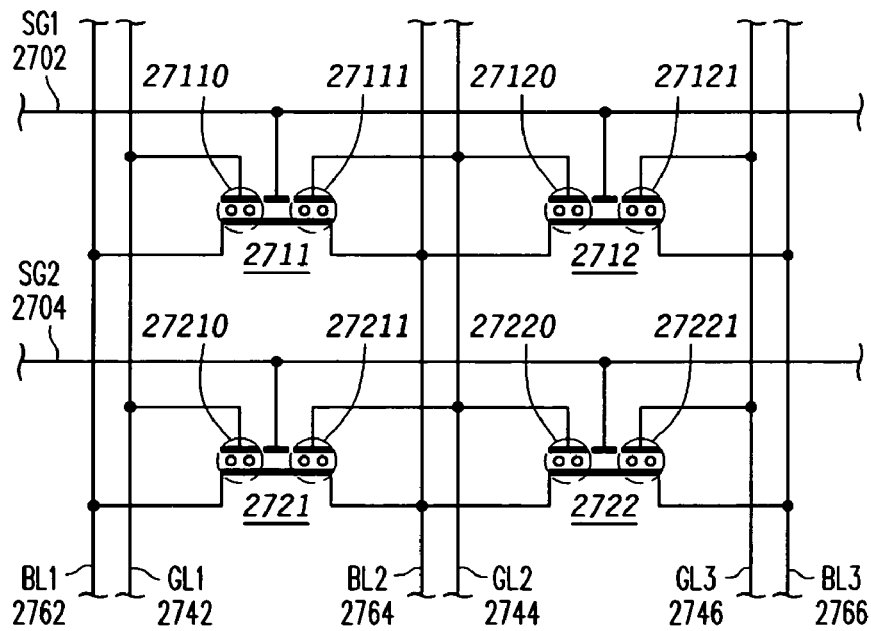

FIG. 31 includes a circuit schematic for an embodiment as described with respect to the embodiment as illustrated in FIG. 32. Memory cells 2711, 2712, 2721, and 2722 are oriented within NVM array 18, as illustrated in FIG. 31. In the figures, "BL" refers to a bit line, "GL" refers to a gate line, "CG" refers to a control gate line, and "SG" refers to a select gate line. Depending on biasing conditions, a GL can be a CG or an SG.

Referring to FIG. 31, BL1 2762 is electrically connected to a S/D region of memory cell 2711 and a S/D region of memory cell 2721. BL2 2764 is electrically connected to the other S/D regions of memory cells 2711 and 2721 and to a S/D region of memory cell 2712 and a S/D region of memory cell 2722. BL3 2766 is electrically connected to the other S/D regions of memory cells 2712 and 2722. GL1 2742 is electrically connected to a gate electrode of memory cell 2711 and a gate electrode of memory cell 2721. GL2 2744 is electrically connected to other gate electrodes of memory cells 2711 and 2721 and to a gate electrode of memory cell 2712 and a gate electrode of memory cell 2722. GL3 2746 is electrically connected to other gate electrodes of memory cells 2712 and 2722. SG1 2702 is electrically connected to a select gate electrode of memory cell 2711 and a select gate electrode of memory cells 2712. SG2 2704 is electrically connected to a select gate electrode of memory cell 2721 and a select gate electrode of memory cell 2722. Memory cell 2711 includes charge storage regions 27110 and 27111. Memory cell 2712 includes charge storage regions 27120 and 27121. Memory cell 2713 includes charge storage regions 27130 and 27131. Memory cell 2714 includes charge storage regions 27140 and 27141.

FIG. 32 illustrates a physical embodiment of a portion of NVM array 18 corresponding to the row that includes memory cells 2711 and 2712. FIG. 32 is substantially the same as FIG. 12 except that reference numbers as used in the circuit schematics are used in FIG. 32.

Charge storage regions for memory cells 2711 and 2712 are illustrated in FIGS. 31 and 32. Memory cell 2711 includes charge storage regions 27110 and 27111, and memory cell 2712 includes charge storage region 27120 and 27121. Memory cells 2721 and 2722 include similar charge storage regions, but such charge storage regions are not specifically identified in FIG. 31. The significance of the charge storage regions will become apparent to skilled artisans after a reading corresponding regarding the operation of the electronic device, as described below.

FIG. 33 includes a table that has some of the operating voltages for memory cells, as illustrated in FIG. 31. "Pgm" means program. References to charge storage regions 27110 and 27111 refer to memory cell 2711, and more particularly to programming or reading discontinuous storage elements under the left-hand gate electrode and right-hand gate electrode of memory cell 2711, respectively. While many voltages are given in the table in FIG. 33 and other tables within this specification, other voltages may be used. The relative values and ratios between the voltages, rather than their absolute values are more relevant, as the absolute values of voltages change with changes in physical parameters.

All memory cells, as illustrated in FIG. 31 can be erased by creating a potential difference in a range of about 12 to 16 volts between substrate 12 and the gate electrodes of the memory cells. In one embodiment, erasing can be performed by placing substrate 12 (or well region therein) to approximately +7 volts, placing the gate lines to −7 volts and allowing the bit lines to electrically float. The SG1 and SG2 may be placed at −7 volts or allowed to electrically float. In another embodiment, erasing can be performed by placing substrate 12 (or well region therein) to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires.

Figures 35, 36:
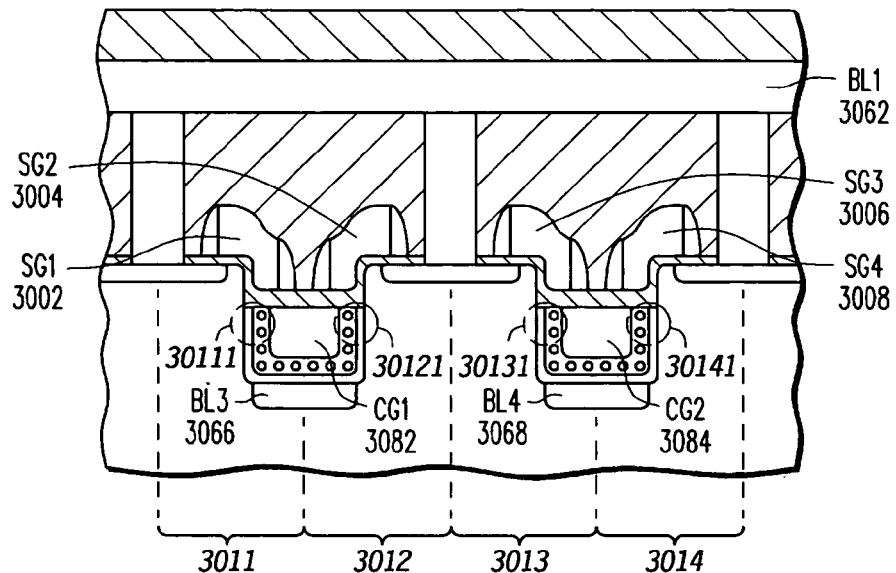

FIG. 34 includes a circuit schematic for an embodiment as described with respect to the embodiment as illustrated in FIG. 35. Memory cells 3011, 3012, 3013, 3014, 3021, 3022, 3023, and 3024 are oriented within NVM array 18, as illustrated in FIG. 34.

Referring to FIG. 34, BL1 3062 is electrically connected to a S/D region of memory cells 3011, 3012, 3013, and 3014. BL2 3064 is electrically connected to a S/D region of memory cells 3021, 3022, 3023, and 3024. BL3 3066 is electrically connected to the other S/D regions of memory cells 3011, 3012, 3021, and 3022. BL4 3068 is electrically connected to the other S/D regions of memory cells 3013, 3014, 3023, and 3024. CG1 3082 is electrically connected to control gate electrodes of memory cell 3011, 3012, 3021, and 3022. CG2 3084 is electrically connected to control gate electrodes of memory cells 3013, 3014, 3023, and 3024. SG1 3002 is electrically connected to select gate electrodes of memory cells 3011 and 3021, SG2 is electrically connected to select gate electrodes of memory cells 3012 and 3022. SG3 is electrically connected to the select gat electrodes of memory cells 3013 and 3023, and SG4 3008 is electrically connected to select gate electrodes of memory cells 3014 and 3024. Bit cell 3011 includes charge storage region 30111. Bit cell 3012 contains charge storage region 30121. Bit cell 3013 includes charge storage region 30131. Bit cell 3014 includes charge storage region 30141. Bit cell 3021 includes charge storage region 30211. Bit cell 3022 includes charge storage region 30221. Bit cell 3023 includes charge storage region 30231. Bit cell 3024 includes charge storage region 30241.

As illustrated in FIG. 34, each of SG1 3002, SG2 3004, SG3 3006, and SG4 3008 is electrically connected to only one column of memory cells. Each of CG1 3082 and CG2 3084 is electrically connected to more than one column of memory cells, and more particularly, are electrically connected to two columns of memory cells.

FIG. 35 illustrates a physical embodiment of a portion of NVM array 18 corresponding to the row that includes memory cells 3011, 3012, 3013, and 3014. FIG. 35 is substantially the same as FIG. 17 except that reference numbers as used in the circuit schematics are used in FIG.

35. FIG. 36 includes a table that has some of the operating voltages for memory cells, as illustrated in FIG. 34. In one exemplary embodiment, charge storage region 30121 of memory cell 3012 is programmed.

All memory cells, as illustrated in FIG. 34 can be erased by creating a potential difference in a range of about 12 to 16 volts between substrate 12 and the gate electrodes of the memory cells. In one embodiment, erasing can be performed by placing substrate 12 (or well region therein) to approximately +7 volts, placing the gate lines to −7 volts and allowing the bit lines to electrically float. The SG1 and SG2 may be placed at −7 volts or allowed to electrically float. In another embodiment, erasing can be performed by placing substrate 12 (or well region therein) to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires.

Figure 37:
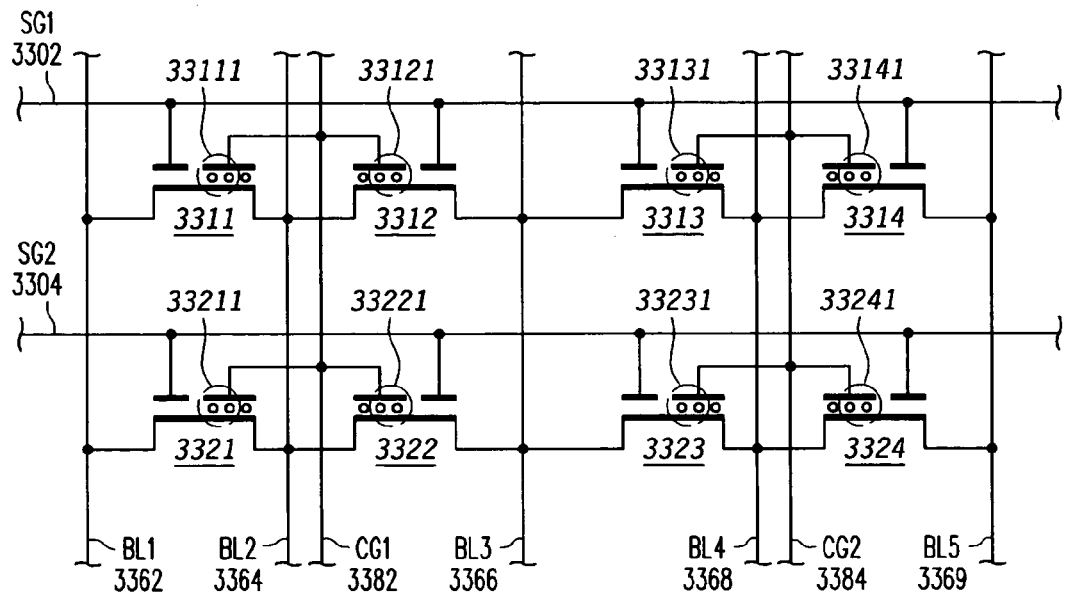
Figure 38:
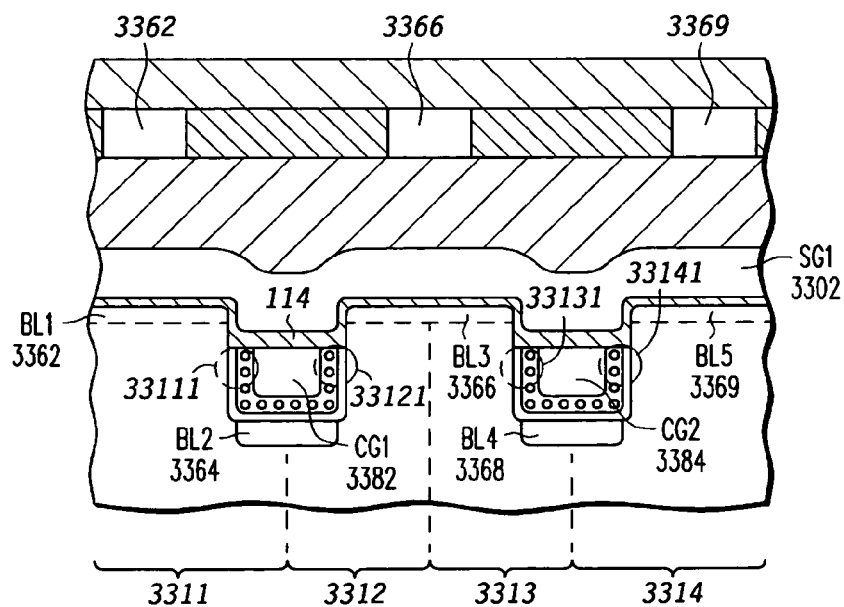

FIG. 37 includes a circuit schematic for an embodiment as described with respect to the embodiment as illustrated in FIG. 38. Memory cells 3311, 3312, 3313, 3314, 3321, 3322, 3323, and 3324 are oriented within NVM array 18, as illustrated in FIG. 37.

Referring to FIG. 37, BL1 3362 is electrically connected to a S/D region of memory cell 3311 and a S/D region of memory cell 3321. BL2 3364 is electrically connected to the other S/D regions of memory cells 3311 and 3321 and to S/D regions of memory cell 3312 and 3322. BL3 3366 is electrically connected to the other S/D regions of memory cell 3312 and 3322 and to S/D regions of memory cell 3313 and 3323. BL4 3368 is electrically connected to the other S/D regions of memory cell 3313 and 3323 and to S/D regions of memory cell 3314 and 3324. BL5 3369 is electrically connected to the other S/D regions of memory cell 3314 and 3324. CG1 3382 is electrically connected to control gate electrodes of memory cell 3311, 3312, 3321 and 3322. CG2 3384 is electrically connected to control gate electrodes of memory cell 3313, 3314, 3323 and 3324. SG1 3302 is electrically connected to select gate electrodes of memory cell 3311, 3312, 3313, and 3314. SG2 3304 is electrically connected to select gate electrodes of memory cell 3321, 3322, 3323, and 3324. Bit cell 3311 includes charge storage region 33111. Bit cell 3312 includes charge storage region 33121. Bit cell 3313 includes charge storage region 33131. Bit cell 3314 includes charge storage region 33141. Bit cell 3321 includes charge storage region 33211. Bit cell 3322 includes charge storage region 33221. Bit cell 3323 includes charge storage region 33231. Bit cell 3324 includes charge storage region 33241.

As illustrated in FIG. 37, each of SG1 3302 and SG2 3304 is electrically connected to only one row of memory cells. Each of CG1 3382 and CG2 3384 is electrically connected to more than one column of memory cells, and more particularly, are electrically connected to two columns of memory cells.

Figures 39, 40:
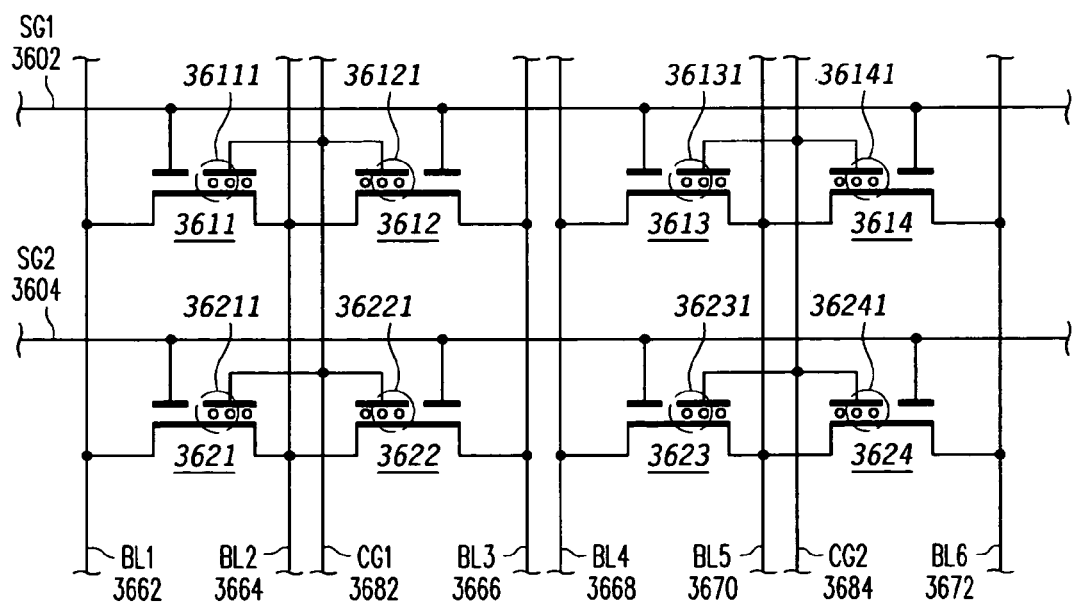

FIG. 38 illustrates a physical embodiment of a portion of NVM array 18 corresponding to the row that includes memory cells 3311, 3312, 3313, and 3314. FIG. 38 is substantially the same as an embodiment of FIG. 20 except that reference numbers used in the circuit schematics are used in FIG. 38. FIG. 39 includes a table that has some of the operating voltages for memory cells, as illustrated in FIG. 37.

All memory cells, as illustrated in FIG. 37 can be erased by creating a potential difference in a range of about 12 to 16 volts between substrate 12 (or well region therein) and the gate electrodes of the memory cells. In one embodiment, erasing can be performed by placing substrate 12 (or well region therein) to approximately +7 volts, placing the gate lines to −7 volts and allowing the bit lines to electrically float. The SG1 and SG2 may be placed at −7 volts or allowed to electrically float. In another embodiment, erasing can be performed by placing substrate 12 (or well region therein) to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires.

The embodiments as described with respect to FIGS. 21 through 24 can be represented by the circuit schematic as illustrated in FIG. 37 and can be operated using the voltages as listed in FIG. 39.

Figures 41, 42:
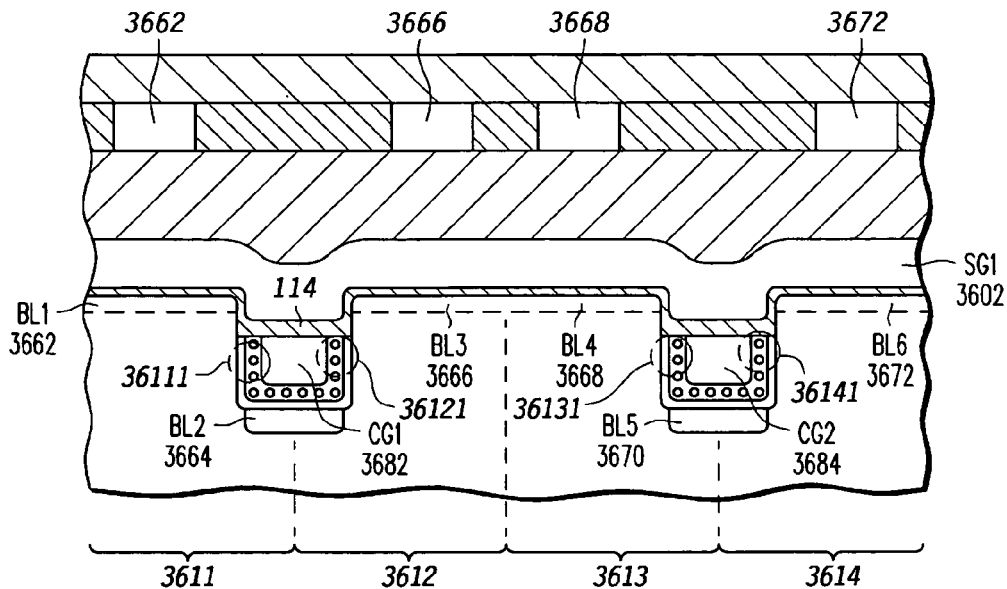

FIG. 40 includes a circuit schematic for an embodiment as described with respect to the embodiment as illustrated in FIG. 41. Memory cells 3611, 3612, 3613, 3614, 3621, 3622, 3623, and 3624 are oriented within NVM array 18, as illustrated in FIG. 40.

Referring to FIG. 40, BL1 3662 is electrically connected to a S/D region of memory cell 3611 and a S/D region of memory cell 3621. BL2 3664 is electrically connected to the other S/D regions of memory cells 3611 and 3621 and to S/D regions of memory cells 3612 and 3622. BL3 3666 is electrically connected to the other S/D regions of memory cells 3612 and 3622. BL4 3668 is electrically connected to S/D regions of memory cells 3613 and 3623. BL5 3670 is electrically connected to the other S/D regions of memory cells 3613 and 3623, and S/D regions of memory cells 3614 and 3624. BL6 3672 is electrically connected to the other S/D regions of memory cells 3614 and 3624. CG1 3682 is electrically connected to control gate electrodes of memory cell 3611, 3612, 3621, and 3622. CG2 3684 is electrically connected to control gate electrodes of memory cell 3613, 3614, 3623, and 3624. SG1 3602 is electrically connected to select gate electrodes of memory cell 3611, 3612, 3613, and 3614. SG2 3604 is electrically connected to select gate electrodes of memory cell 3621, 3622, 3623, and 3624. Bit cell 3611 includes charge storage region 36111. Bit cell 3612 includes charge storage region 36121. Bit cell 3613 includes charge storage region 36131. Bit cell 3614 includes charge storage region 36141. Bit cell 3621 includes charge storage region 36211. Bit cell 3622 includes charge storage region 36221. Bit cell 3623 includes charge storage region 36231. Bit cell 3624 includes charge storage region 36241.

As illustrated in FIG. 40, each of BL1 3662, BL3 3666, BL4 3668, and BL6 3672 is electrically connected to only one column of memory cells. Each of BL2 3664 and BL5 3670 is electrically connected to more than one column of memory cells, and more particularly, are electrically connected to two columns of memory cells.

FIG. 41 illustrates a physical embodiment of a portion of NVM array 18 corresponding to the row that includes memory cells 3611, 3612, 3613, and 3614. FIG. 41 is substantially the same as FIG. 28 except that reference numbers as used in the circuit schematics are used in FIG. 41. FIG. 42 includes a table that has some of the operating voltages for memory cells, as illustrated in FIG. 40.

All memory cells, as illustrated in FIG. 40 can be erased by creating a potential difference in a range of about 12 to 16 volts between substrate 12 and the gate electrodes of the memory cells. In one embodiment, erasing can be performed by placing substrate 12 (or well region therein) to approximately +7 volts, placing the gate lines to −7 volts and allowing the bit lines to electrically float. The SG1 and SG2 may be placed at −7 volts or allowed to electrically float. In another embodiment, erasing can be performed by placing substrate 12 (or well region therein) to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires.

Many details have been described with respect to NVM array 18, its memory cells, bit lines, and gate lines. After reading this specification, skilled artisans will appreciate that the row and column orientations can be reversed. Electrically connections between memory cells and their associated bit lines, gate lines, or any combination thereof along one or more rows can be changed to one or more columns. Similarly, electrically connections between memory cells and their associated bit lines, gate lines, or any combination thereof along one or more columns can be changed to one or more rows.

Embodiments as described herein are useful in forming NMV arrays or a portion thereof. The use of discontinuous storage elements within a trench in the substrate allows smaller memory cells to be formed and increase memory density. The discontinuous storage elements can also allow more bits to be stored within a memory cell as opposed to a conventional floating gate structure. The fabrication of the NVM array can be implemented using existing materials and equipment. Therefore, process integration would not require developing new processes for new equipment or having to address materials incompatibility issues. The memory cells can be formed such that select gate lines are formed, such that they are at least partly recessed within the trenches.

Source-side injection can be used to program memory cells. The thickness of the intergate dielectric portions 114 and 115 and programming voltages can be selected to allow a relatively larger electrical field to be generated near the intergate dielectric portions 114 and 115 as compared to near the S/D regions that are electrically connected to the bit lines. The source-side injection allows programming times similar to conventional hot-electron injection and has a higher electron efficiency compared to conventional hot-electron injection.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a substrate including a first trench that includes a wall and a bottom and extends from a primary surface of the substrate. The electronic device can also include discontinuous storage elements, wherein a first portion of the discontinuous storage elements lies at least within the first trench. The electronic device can further include a first gate electrode, wherein at least a part of the first portion of the discontinuous storage elements lies between the first gate electrode and the wall of the first trench. The electronic device can still further include a second gate electrode overlying the first gate electrode and the primary surface of the substrate.

In one embodiment of the first aspect, the first gate electrode has an upper surface that lies below the primary surface of the substrate. In a particular embodiment, the second gate electrode extends at least partly into the first trench. In another particular embodiment, the electronic device further includes a third gate electrode. The substrate further includes a second trench that is spaced apart from the first trench, wherein the second trench includes a wall and a bottom and extends from the primary surface of the substrate, and a second portion of the discontinuous storage elements lies at least within the second trench. The third gate electrode has an upper surface that lies below the primary surface of the substrate, wherein at least a part of the second portion of the discontinuous storage elements lies between the third gate electrode and the wall of the second trench.

In a more particular embodiment of the first aspect, the electronic device further includes a first doped region lying within the substrate below the first trench, and a second doped region lying within the substrate below the second trench. In an even more particular embodiment, the electronic device further includes a third doped region lying along the primary surface of the substrate between the first and second trenches. In still an even more particular embodiment, the third doped region extends to the walls of the first and second trenches. In another still even more particular embodiment, the third doped region is spaced apart from the walls of the first and second trenches.

In another more particular embodiment of the first aspect, the electronic device further includes a first charge storage region that includes a first discontinuous storage element within the first portion of the discontinuous storage elements, wherein the first discontinuous storage element lies closer to the upper surface of the first gate electrode than the first doped region. The electronic device also includes a second charge storage region that includes a second discontinuous storage element within the second portion of the discontinuous storage elements, wherein the second discontinuous storage element lies closer to the upper surface of the third gate electrode than the second doped region, and wherein the second charge storage region is spaced apart from the first charge storage region.

In a further particular embodiment of the first aspect, the second gate electrode overlies the first gate electrode, the third gate electrode, and a portion of the substrate between the first and second trenches. In still another particular embodiment, the electronic device further includes a fourth gate electrode, wherein the second gate electrode overlies the first gate electrode and a first portion of the substrate between the first and second trenches, and the fourth gate electrode overlies the third gate electrode and a second portion of the substrate between the first and second trenches.

In another embodiment of the first aspect, the electronic device further includes a first dielectric layer lying along the wall and bottom of the first trench, and a second dielectric layer lying between the first portion of the discontinuous storage elements and the first gate electrode. In a further embodiment, the discontinuous storage elements include silicon nanocrystals or metal nanoclusters. In yet another embodiment, the electronic device further includes an array, wherein the substrate includes a plurality of trenches, including the first trench, and within the array, the discontinuous storage elements lie within the trenches of the substrate. In a particular embodiment, the electronic device further includes a first dielectric layer overlying the first gate electrode and includes an upper surface within the first trench, wherein the first portion of the discontinuous storage elements is spaced apart from the primary surface of the substrate, and substantially none of the discontinuous storage elements overlie the primary surface of the substrate between the trenches within the array.

In still another embodiment of the first aspect, from a cross-sectional view, the first gate electrode has a substantially rectangular shape. In still a further embodiment, from a cross-sectional view, the first gate electrode includes portions, and the portions of the first gate electrode include curved outer surfaces that face each other.

In a second aspect, an electronic device can include a substrate including a first trench and a second trench that are spaced apart from each other, wherein each of the first and second trenches includes a wall and a bottom and extends from a primary surface of the substrate. The electronic device can also include discontinuous storage elements, wherein a first portion of the discontinuous storage elements lies within the first trench, and a second portion of the discontinuous storage elements lies at least within the second trench. The electronic device can also include a first gate electrode lying within the first trench and having an upper surface that lies below the primary surface of the substrate, wherein at least a part of the first portion of the discontinuous storage elements lies between the first gate electrode and the wall of the first trench. The electronic device can further include a second gate electrode lying within the second trench and having an upper surface that lies below the primary surface of the substrate, wherein at least a part of the second portion of the discontinuous storage elements lies between the second gate electrode and the wall of the second trench, and a third gate electrode overlying at least one of the first gate electrode or the second gate electrode.

In one embodiment of the second aspect, the electronic device further includes a first doped region lying within the substrate along the bottom of the first trench, a second doped region lying within the substrate along the bottom of the second trench, and a third doped region lying along the primary surface of the substrate between the first and second trenches.

In a third aspect, an electronic device can include a substrate including a first trench and a second trench that are spaced apart from each other, wherein each of the first and second trenches includes a wall and a bottom and extends from a primary surface of the substrate. The electronic device can also include a first doped region lying within the substrate along the bottom of the first trench, a second doped region lying within the substrate along the bottom of the second trench, and a first dielectric layer lying along the walls and bottoms of the first and second trenches. The electronic device can further include discontinuous storage elements, wherein a first portion of the discontinuous storage elements lies within the first trench, and a second portion of the discontinuous storage elements lies within the second trench, the first and second portions of the discontinuous storage elements are spaced apart from the primary surface of the substrate, and substantially none of the discontinuous storage elements overlie the primary surface of the substrate between the first and second trenches. The electronic device can still further include a second dielectric layer adjacent to the discontinuous storage elements within the first and second trenches. The electronic device can yet further include a first gate electrode lying within the first trench and having an upper surface that lies below the primary surface of the substrate, wherein at least a part of the first portion of the discontinuous storage elements lies between the first gate electrode and the wall of the first trench. The electronic device can also include a second gate electrode lying within the first trench and having an upper surface that lies below the primary surface of the substrate, wherein at least a part of the first portion of the discontinuous storage elements lies between the first gate electrode and the wall of the first trench. The electronic device can further include a third dielectric layer including a first portion overlying the first gate electrode within the first trench and a second portion overlying the second gate electrode within the second trench. The electronic device can still further include a third gate electrode overlying the third dielectric layer and at least one of the first gate electrode or the second gate electrode, wherein the third gate electrode lies at least partly within the first trench and the second trench.

In a fourth aspect, a process for forming an electronic device can include forming a first trench within a substrate, wherein the first trench includes a wall and a bottom and extends from a primary surface of the substrate, and forming discontinuous storage elements over the primary surface of the substrate and within the first trench. The process can also include forming a first gate electrode within the first trench after forming the discontinuous storage elements, wherein a first discontinuous storage element of the discontinuous storage elements lies between the first gate electrode and the wall of the first trench. The process can further include removing the discontinuous storage elements that overlie the primary surface of the substrate, wherein a first portion of the discontinuous storage elements remains within the first trench. The process can still further include forming a second gate electrode after removing the discontinuous storage elements, wherein the second gate electrode overlies the first gate electrode and the primary surface of the substrate.

In one embodiment of the fourth aspect, forming the first gate electrode includes forming the first gate electrode, such that an upper surface of the first gate electrode lies below the primary surface of the substrate. Forming the second gate electrode includes forming the second gate electrode, such that a portion of the second gate electrode extends into the first trench. In another embodiment, the process further includes forming a third gate electrode within a second trench. Forming the first trench further includes forming the second trench that is spaced apart from the first trench, wherein the second trench includes a wall and a bottom and extends from a primary surface of the substrate. Forming the discontinuous storage elements further includes forming the discontinuous storage elements within the second trench. Forming the third gate electrode includes forming the third gate electrode, such that a second discontinuous storage element of the discontinuous storage elements lies between the third gate electrode and the wall of the second trench. Removing the discontinuous storage elements includes removing the discontinuous storage elements that overlie the primary surface of the substrate, wherein a second portion of the discontinuous storage elements remains within the second trench.

In a particular embodiment, the process further includes forming a first doped region and a second doped region along the bottoms of the first and second trenches, respectively. In a more particular embodiment, the process further includes forming a third doped region lying along the primary surface of the substrate between the first and second trenches. In an even more particular embodiment, forming the third doped region is performed before forming the second gate electrode. In another even more particular embodiment, forming the third doped region is performed after forming the second gate electrode.

In another particular embodiment, removing the discontinuous storage elements includes removing the discontinuous storage elements such that the first discontinuous storage element is part of a first charge storage region and lies closer to an upper surface of the first gate electrode than the first doped region, and the second discontinuous storage element is part of a second charge storage region and lies closer to an upper surface of the third gate electrode than the second doped region, wherein the second charge storage region is spaced apart from the first charge storage region.

In yet another particular embodiment, forming the second gate electrode includes forming the second gate electrode, such that the second gate electrode overlies the first and third gate electrodes, and from a top view, lengths of the first and second trenches are substantially perpendicular to a length of the second gate electrode. In still another particular embodiment, the process further includes forming a fourth gate electrode. Forming the second gate electrode includes forming the second gate electrode, such that the second gate electrode overlies the first gate electrode, and forming the fourth gate electrode includes forming the fourth gate electrode, such that the fourth gate electrode that overlies the third gate electrode. From a top view, a length of the first trench is substantially parallel to a length of the second gate electrode, and a length of the second trench is substantially parallel to a length of the fourth gate electrode.

In a further embodiment of the fourth aspect, the process further includes forming a first dielectric layer lying along the wall and bottom of the first trench, forming a second dielectric layer after forming the discontinuous storage elements, and forming a third dielectric layer after forming the first gate electrode. In a more particular embodiment, forming the third dielectric layer and removing the discontinuous storage elements that overlie the primary surface of the substrate include oxidizing exposed portions of the first gate electrode and the discontinuous storage elements that lie at an elevation between the first gate electrode and the primary surface of the substrate.

In another embodiment of the fourth aspect, forming the first gate electrode includes forming a conductive layer after forming the discontinuous storage elements, polishing the conductive layer to a remove portion of the conductive layer that overlies the primary surface of the substrate, and recessing the conductive layer within the first trench to form the first gate electrode, such that an upper surface of the first gate electrode lies below the primary surface. In still another embodiment, forming the first gate electrode includes forming a conductive layer after forming the discontinuous storage elements, and anisotropically etching the conductive layer to form the first gate electrode, which from a cross-sectional view, has a sidewall spacer shape. In yet a further embodiment, forming the discontinuous storage elements includes forming silicon nanocrystals or forming metal nanoclusters.

In a fifth aspect, a process for forming an electronic device can include forming a first trench and a second trench within a substrate, wherein the first and second trenches are spaced apart from each other, and each of the first and second trenches includes a wall and a bottom and extends from a primary surface of the substrate. The process can also include forming discontinuous storage elements over the primary surface of the substrate and within the first and second trenches. The process can also include forming a first conductive layer after forming the discontinuous storage elements and removing a portion of the first conductive layer that overlies the primary surface of the substrate to form a first gate electrode within the first trench and a second gate electrode within the second trench. A first portion of the discontinuous storage elements lies between the first gate electrode and the wall of the first trench, and a second portion of the discontinuous storage elements lies between the second gate electrode and the wall of the second trench. The process can still further includes removing the discontinuous storage elements that overlie the primary surface of the substrate, forming a second conductive layer after removing the discontinuous storage elements that overlie the primary surface of the substrate, and patterning the second conductive layer to form a third gate electrode overlying the primary surface of the substrate and at least one of the first gate electrode or the second gate electrode.

In one embodiment of the fifth aspect, the process further includes forming a first doped region and a second doped region along the bottoms of the first and second trenches, respectively. In a further embodiment, the process further includes forming a third doped region that lies along the primary surface of the substrate between the first and second trenches. In another embodiment, removing a portion of the first conductive layer includes recessing the first conductive layer within the first and second trenches to form the first and second gate electrodes, such that upper surfaces of the first and second gate electrodes lie below the primary surface.

In a sixth aspect, process for forming an electronic device can include forming a first trench and a second trench within a substrate, wherein the first and second trenches are spaced apart from each other, and each of the first and second trenches includes a wall and a bottom and extends from a primary surface of the substrate. The process can also include forming a first doped region and a second doped region, wherein the first doped region lies within the substrate along the bottom of the first trench, and the a second doped region lies within the substrate along the bottom of the second trench. The process can further include forming a first dielectric layer lying along the walls and bottoms of the first and second trenches, forming discontinuous storage elements after forming the first dielectric layer, and forming a second dielectric layer after forming the discontinuous storage elements. The process can still further include forming a first conductive layer after forming the second dielectric layer and patterning the first conductive layer to form a first gate electrode within the first trench and a second gate electrode within the second trench. The first gate electrode has an upper surface that lies below the primary surface of the substrate, wherein a first part of the discontinuous storage elements lies between the first gate electrode and the wall of the first trench, and the second gate electrode has an upper surface that lies below the primary surface of the substrate, wherein a second part of the discontinuous storage elements lies between the second gate electrode and the wall of the second trench. The process can yet even further include removing a third part of the discontinuous storage elements to leave remaining portions of the discontinuous storage elements, including a first portion of the discontinuous storage elements and a second portion of the discontinuous storage elements. The first portion of the discontinuous storage elements lies within the first trench, and the second portion of the discontinuous storage elements lies within the second trench, the first and second portions of the discontinuous storage elements are spaced apart from the primary surface of the substrate, and substantially none of the discontinuous storage elements overlie the primary surface of the substrate between the first and second trenches.

The process can also include forming a third dielectric layer wherein a first portion of the third dielectric layer overlies the first gate electrode within the first trench, and a second portion of the third dielectric layer overlies the second gate electrode within the second trench. The process can also include forming a second conductive layer after forming the third dielectric layer, and patterning the second conductive layer to form a third gate electrode overlying the third dielectric layer, wherein the third gate electrode lies at least partly within the first trench and the second trench.

In a seventh aspect, an electronic device can include a first set of memory cells oriented substantially along a first direction, and a second set of memory cells oriented substantially along the first direction. The electronic device can also include a first gate line electrically connected to the first set of memory cells, and a second gate line electrically connected to the second set of memory cells, wherein, when compared to the first gate line, the second gate line is electrically connected to more sets of memory cells that lie along the first direction.

In one embodiment of the seventh aspect, the first gate line is a select gate line, and the second gate line is a control gate line. In a particular embodiment, each memory cell within the first and second sets of memory cells includes a nonvolatile memory cell that includes a select gate electrode and a control gate electrode. The first gate line is electrically connected to the select gate electrodes of the first set of memory cells, and the second gate line is electrically connected to the control gate electrodes of the second set of memory cells. In a more particular embodiment, the discontinuous storage elements lie between channel regions and the control gate electrodes of the first and second sets of memory cells, and substantially no discontinuous storage elements lie between channel regions and the select gate electrodes of the first and second sets of memory cells.

In another embodiment of the seventh aspect, the first direction is associated with a row or a column. In another embodiment, the first gate line is electrically connected to one row or one column of memory cells, and the second gate line is electrically connected to two rows or two columns of memory cells. In a further embodiment, the electronic device further includes a third set of memory cells oriented substantially along the first direction, wherein the first, second, and third sets of memory cells lie within different rows or different columns as compared to one another. Each memory cell within the third set of memory cells includes a control gate electrode and a select gate electrode, and the second gate line is electrically connected to the control gate electrodes of the second and third sets of memory cells.

In a particular embodiment of the seventh aspect, the electronic device further includes a first bit line, a second bit line, and a third bit line, wherein the first bit line is electrically connected to the first set of memory cells, and the second bit line is electrically connected to the second and third sets of memory cells. The third bit line is electrically connected to a first memory cell that is a part of the first set of memory cells but is not a part of the second set of memory cells, and to a second memory cell that is a part of the second set of memory cells but is not a part of the first set of memory cells. In a further particular embodiment, the first and second bit lines are electrically connected to memory cells oriented substantially along the first direction, and the third bit line is electrically connected to memory cells oriented substantially along a second direction that is substantially perpendicular to the first direction.

In a eighth aspect, an electronic device can include a first set of memory cells oriented substantially along a first direction, and a second set of memory cells oriented substantially along a second direction that is substantially perpendicular to the first direction. The electronic device can also include a first gate line electrically connected to the first set of memory cells, wherein the first set of memory cells includes a first memory cell that is not a part of the second set of memory cells, and a second memory cell that is a part of the second set of memory cells. The electronic device can further include a second gate line electrically connected to the second set of memory cells, wherein the second gate line is electrically connected to more sets of memory cells oriented substantially along the second direction as compared to the first gate line being electrically connected to memory cells oriented substantially along the first direction.

In a ninth aspect, an electronic device can include a first set of memory cells oriented substantially along a first direction, and a second set of memory cells oriented substantially along the first direction. The electronic device can also include a first bit line electrically connected to the first set of memory cells, and a second bit line electrically connected to the second set of memory cells, wherein, when compared to the first bit line, the second bit line is electrically connected to more sets of memory cells along the first direction.

In one embodiment of the ninth aspect, each memory cell within the first and second sets of memory cells includes a nonvolatile memory cell that includes a select gate electrode and a control gate electrode. In a particular embodiment, discontinuous storage elements lie between channel regions and the control gate electrodes of the first and second sets of memory cells, and substantially no discontinuous storage elements lie between channel regions and the select gate electrodes of the first and second sets of memory cells. In another embodiment, the first direction is associated with a row or a column.

In a further embodiment of the ninth aspect, the electronic device further includes a third set of memory cells, wherein the first, second, and third sets of memory cells lie within different rows or different columns as compared to one another, the third set of memory cells is oriented substantially along the first direction, and the second bit line is electrically connected to the third set of memory cells. In yet another embodiment, the first bit line is electrically connected to one row or one column of memory cells, and the second bit line is electrically connected to two rows or two columns of memory cells.

In still yet another embodiment of the ninth aspect, the electronic device further includes a first gate line, a second gate line, and a third gate line. The first gate line is electrically connected to the first set of memory cells, and the second gate line is electrically connected to the second set of memory cells. The third gate line is electrically connected to a first memory cell that is a part of the first set of memory cells but is not a part of the second set of memory cells, and a second memory cell that is a part of the second set of memory cells but is not a part of the first set of memory cells. In a more particular embodiment, each of the first and second gate lines is a control gate line, and the third gate line is a select gate line.

In another more particular embodiment, the first and second gate lines are electrically connected to memory cells oriented substantially along the first direction, and the third gate line is electrically connected to memory cells oriented substantially along a second direction that is substantially perpendicular to the first direction. In an even more particular embodiment, discontinuous storage elements lie between control gate electrodes and channel regions of the second and third sets of memory cells, and substantially no discontinuous storage elements lie between select gate electrodes and channel regions of the first set of memory cells.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process for forming an electronic device, the process comprising:
    forming a first trench and a second trench within a substrate, wherein:
        the first and second trenches are spaced apart from each other; and
        each of the first and second trenches includes a wall and a bottom and extends from a primary surface of the substrate;
    forming a first doped region and a second doped region, wherein the first doped region lies within the substrate along the bottom of the first trench, and the a second doped region lies within the substrate along the bottom of the second trench;
    forming a first dielectric layer lying along the walls and bottoms of the first and second trenches;
    forming discontinuous storage elements after forming the first dielectric layer;
    forming a second dielectric layer after forming the discontinuous storage elements;
    forming a first conductive layer after forming the second dielectric layer;
    patterning the first conductive layer to form a first gate electrode within the first trench and a second gate electrode within the second trench, wherein:
        the first gate electrode has an upper surface that lies below the primary surface of the substrate, wherein a first part of the discontinuous storage elements lies between the first gate electrode and the wall of the first trench; and
        the second gate electrode has an upper surface that lies below the primary surface of the substrate, wherein a second part of the discontinuous storage elements lies between the second gate electrode and the wall of the second trench;
    removing a third part of the discontinuous storage elements to leave remaining portions of the discontinuous storage elements, including a first portion of the discontinuous storage elements and a second portion of the discontinuous storage elements, wherein:
        the first portion of the discontinuous storage elements lies within the first trench;
        the second portion of the discontinuous storage elements lies within the second trench;
        the first and second portions of the discontinuous storage elements are spaced apart from the primary surface of the substrate; and
        substantially none of the discontinuous storage elements overlie the primary surface of the substrate between the first and second trenches;
    forming a third dielectric layer, wherein:
        a first portion of the third dielectric layer overlies the first gate electrode within the first trench; and
        a second portion of the third dielectric layer overlies the second gate electrode within the second trench;
    forming a second conductive layer after forming the third dielectric layer; and
    patterning the second conductive layer to form a third gate electrode overlying the third dielectric layer, wherein the third gate electrode lies at least partly within the first trench and the second trench.

2. A process for forming an electronic device, the process comprising:
    forming a first trench within a substrate, wherein the first trench includes a wall and a bottom and extends from a primary surface of the substrate;
    forming discontinuous storage elements over the primary surface of the substrate and within the first trench;
    forming a first gate electrode within the first trench after forming the discontinuous storage elements, wherein a first discontinuous storage element of the discontinuous storage elements lies between the first gate electrode and the wall of the first trench;
    removing the discontinuous storage elements that overlie the primary surface of the substrate, wherein a first portion of the discontinuous storage elements remains within the first trench;
    forming a second gate electrode after removing the discontinuous storage elements, wherein the second gate electrode overlies the first gate electrode and the primary surface of the substrate.

3. The process of claim 2, wherein:
    forming the first gate electrode comprises forming the first gate electrode, such that an upper surface of the first gate electrode lies below the primary surface of the substrate; and
    forming the second gate electrode comprises forming the second gate electrode, such that a portion of the second gate electrode extends into the first trench.

4. The process of claim 2, further comprising:
    forming a first dielectric layer lying along the wall and bottom of the first trench;
    forming a second dielectric layer after forming the discontinuous storage elements; and
    forming a third dielectric layer after forming the first gate electrode.

5. The process of claim 4, wherein forming the third dielectric layer and removing the discontinuous storage elements that overlie the primary surface of the substrate comprise oxidizing:
    exposed portions of the first gate electrode; and
    the discontinuous storage elements that lie at an elevation between the first gate electrode and the primary surface of the substrate.

6. The process of claim 2, wherein forming the first gate electrode comprises:
   forming a conductive layer after forming the discontinuous storage elements;
   polishing the conductive layer to remove portion of the conductive layer that overlies the primary surface of the substrate; and
   recessing the conductive layer within the first trench to form the first gate electrode, such that an upper surface of the first gate electrode lies below the primary surface.

7. The process of claim 2, wherein forming the first gate electrode comprises:
   forming a conductive layer after forming the discontinuous storage elements; and
   anisotropically etching the conductive layer to form the first gate electrode, which from a cross-sectional view, has a sidewall spacer shape.

8. The process of claim 2, wherein forming the discontinuous storage elements comprises forming silicon nanocrystals or forming metal nanoclusters.

9. The process of claim 2, further comprising forming a third gate electrode within a second trench, wherein:
   forming the first trench further includes forming the second trench that is spaced apart from the first trench, wherein the second trench includes a wall and a bottom and extends from a primary surface of the substrate;
   forming the discontinuous storage elements further includes forming the discontinuous storage elements within the second trench;
   forming the third gate electrode comprising forming the third gate electrode, such that a second discontinuous storage element of the discontinuous storage elements lies between the third gate electrode and the wall of the second trench; and
   removing the discontinuous storage elements comprises removing the discontinuous storage elements that overlie the primary surface of the substrate, wherein a second portion of the discontinuous storage elements remains within the second trench.

10. The process of claim 9, further comprising forming a first doped region and a second doped region along the bottoms of the first and second trenches, respectively.

11. The process of claim 10, further comprising forming a third doped region lying along the primary surface of the substrate between the first and second trenches.

12. The process of claim 11, wherein forming the third doped region is performed before forming the second gate electrode.

13. The process of claim 11, wherein forming the third doped region is performed after forming the second gate electrode.

14. The process of claim 9, wherein removing the discontinuous storage elements comprises removing the discontinuous storage elements, such that:
   the first discontinuous storage element is part of a first charge storage region and lies closer to an upper surface of the first gate electrode than the first doped region; and
   the second discontinuous storage element is part of a second charge storage region and lies closer to an upper surface of the third gate electrode than the second doped region, wherein the second charge storage region is spaced apart from the first charge storage region.

15. The process of claim 9, wherein forming the second gate electrode comprises:
   forming the second gate electrode, such that:
   the second gate electrode overlies the first and third gate electrodes; and
   from a top view, lengths of the first and second trenches are substantially perpendicular to a length of the second gate electrode.

16. The process of claim 9, further comprising forming a fourth gate electrode, wherein:
   forming the second gate electrode comprises forming the second gate electrode, such that the second gate electrode overlies the first gate electrode;
   forming the fourth gate electrode comprises forming the fourth gate electrode, such that the fourth gate electrode overlies the third gate electrode; and
   from a top view:
   a length of the first trench is substantially parallel to a length of the second gate electrode; and
   a length of the second trench is substantially parallel to a length of the fourth gate electrode.

17. A process for forming an electronic device, the process comprising:
   forming a first trench and a second trench within a substrate, wherein:
   the first and second trenches are spaced apart from each other; and
   each of the first and second trenches includes a wall and a bottom and extends from a primary surface of the substrate;
   forming discontinuous storage elements over the primary surface of the substrate and within the first and second trenches;
   forming a first conductive layer after forming the discontinuous storage elements;
   removing a portion of the first conductive layer that overlies the primary surface of the substrate to form a first gate electrode within the first trench and a second gate electrode within the second trench, wherein:
   a first portion of the discontinuous storage elements lies between the first gate electrode and the wall of the first trench; and
   a second portion of the discontinuous storage elements lies between the second gate electrode and the wall of the second trench;
   removing the discontinuous storage elements that overlie the primary surface of the substrate;
   forming a second conductive layer after removing the discontinuous storage elements that overlie the primary surface of the substrate; and
   patterning the second conductive layer to form a third gate electrode overlying the primary surface of the substrate and at least one of the first gate electrode or the second gate electrode.

18. The process of claim 17, further comprising forming a first doped region and a second doped region along the bottoms of the first and second trenches, respectively.

19. The process of claim 16, further comprising forming a third doped region that lies along the primary surface of the substrate between the first and second trenches.

20. The process of claim 17, wherein removing a portion of the first conductive layer comprises recessing the first conductive layer within the first and second trenches to form the first and second gate electrodes, such that upper surfaces of the first and second gate electrodes lie below the primary surface.

* * * * *

UNITED STATES PATENT AND TRADEMARK OFFICE
CERTIFICATE OF CORRECTION

PATENT NO. : 7,211,487 B2 Page 1 of 1
APPLICATION NO. : 11/188939
DATED : May 1, 2007
INVENTOR(S) : Gowrishankar L. Chindalore et al.

It is certified that error appears in the above-identified patent and that said Letters Patent is hereby corrected as shown below:

Column No. 27, Line No. 42, change "the a second" to --the second--

Signed and Sealed this

Sixth Day of November, 2007

JON W. DUDAS
*Director of the United States Patent and Trademark Office*